US007356374B2

United States Patent
Suttile et al.

(10) Patent No.: US 7,356,374 B2
(45) Date of Patent: Apr. 8, 2008

(54) COMPREHENSIVE FRONT END METHOD AND SYSTEM FOR AUTOMATICALLY GENERATING AND PROCESSING PHOTOMASK ORDERS

(75) Inventors: Edward J. Suttile, Oxford, CT (US); Christopher J. Progler, Plano, TX (US)

(73) Assignee: Photronics, Inc., Brookfield, CT (US)

( * ) Notice: Subject to any disclaimer, the term of this patent is extended or adjusted under 35 U.S.C. 154(b) by 95 days.

(21) Appl. No.: 11/140,004

(22) Filed: May 27, 2005

(65) Prior Publication Data

US 2005/0278046 A1 Dec. 15, 2005

Related U.S. Application Data

(63) Continuation-in-part of application No. 10/852,532, filed on May 24, 2004, now Pat. No. 6,996,450, which is a continuation of application No. 10/099,622, filed on Mar. 14, 2002, now Pat. No. 6,760,640, application No. 11/140,004, and a continuation-in-part of application No. 10/981,201, filed on Nov. 3, 2004, which is a continuation-in-part of application No. 10/877,001, filed on Jun. 25, 2004, which is a continuation-in-part of application No. 10/209,254, filed on Jul. 30, 2002, now Pat. No. 6,842,881.

(51) Int. Cl.
    G06F 19/00 (2006.01)

(52) U.S. Cl. .......................... 700/97; 716/19

(58) Field of Classification Search .............. 700/97, 700/121, 125; 716/19, 20, 21
See application file for complete search history.

(56) References Cited

U.S. PATENT DOCUMENTS

| | | | | |
|---|---|---|---|---|
| 5,448,494 A | * | 9/1995 | Kobayashi et al. | 716/5 |
| 6,330,708 B1 | * | 12/2001 | Parker et al. | 716/19 |
| 6,622,295 B1 | * | 9/2003 | Schepp et al. | 716/19 |
| 6,665,857 B2 | * | 12/2003 | Ayres | 716/19 |
| 6,708,323 B2 | * | 3/2004 | Ohta et al. | 716/19 |

* cited by examiner

Primary Examiner—Kidest Bahta
Assistant Examiner—Chad Rapp
(74) Attorney, Agent, or Firm—Amster, Rothstein & Ebenstein LLP

(57) ABSTRACT

The present invention relates to a comprehensive front-end method and system for automatically generating and processing photomask orders. This method and system includes two separate, but related software components. The first software component of the present invention is used to generate a photomask order in a specified format. The second software component of the present invention processes at least a portion of the photomask order (which was generated using the first software component) into a substantially ready-to-write jobdeck file and/or a substantially ready-to-write inspection file, which in turn is transferred to a remote photomask manufacturer's system to manufacture a photomask. These software components can be installed as separate programs on a computer system or operate as a single software package performing multiple functions.

20 Claims, 9 Drawing Sheets

PRIOR ART

PRIOR ART

PRIOR ART

COMPREHENSIVE FRONT END METHOD AND SYSTEM FOR AUTOMATICALLY GENERATING AND PROCESSING PHOTOMASK ORDERS

CROSS-REFERENCE TO RELATED APPLICATIONS

This patent application is a continuation-in-part of the following patent applications: (1) U.S. patent application Ser. No. 10/852,532, filed May 24, 2004, entitled "Automated Manufacturing Process And Method For Processing Photomasks," now U.S. Pat. No. 6,996,450, which is a continuation of U.S. patent application Ser. No. 10/099,622, filed Mar. 14, 2002 (now U.S. Pat. No. 6,760,640); and (2) U.S. patent application Ser. No. 10/981,201, filed Nov. 3, 2004 and entitled "User-Friendly Rule-Based System And Methods For Automatically Generating Photomask Orders," which is a continuation-in-part of U.S. patent application Ser. No. 10/877,001, filed on Jun. 25, 2004, which is a continuation-in-part of U.S. patent application Ser. No. 10/209,254, filed on Jul. 30, 2002 (now U.S. Pat. No. 6,842,881). The contents of these applications are incorporated herein by reference in their entirety.

FIELD OF THE INVENTION

The present invention generally relates to a comprehensive front-end method and system for automatically generating and processing photomask orders. More particularly, the present invention relates to a software-based application which generates a photomask order in a specified format and then processes that photomask order into a substantially ready-to-write jobdeck file and a substantially ready-to-write inspection file, which in turn, is transferred to a remote photomask manufacturer's system for manufacture of a photomask.

BACKGROUND OF THE INVENTION

Photomasks are high precision plates containing microscopic images of electronic circuits. Photomasks are typically made from very flat pieces of quartz or glass with a layer of chrome on one side. Etched in the chrome is a portion of an electronic circuit design. This circuit design on the mask is also called "geometry."

A typical photomask used in the production of semiconductor devices is formed from a "blank" or "undeveloped" photomask. As shown in FIG. 1, a typical blank photomask 10 is comprised of three or four layers. The first layer 11 is a layer of quartz or other substantially transparent material, commonly referred to as the substrate. The next layer is typically a layer of opaque material 12, such as Cr, which often includes a third layer of antireflective material 13, such as CrO. The antireflective layer may or may not be included in any given photomask. The top layer is typically a layer of photosensitive resist material 14. Other types of photomasks are also known and used including, but not limited to, phase shift masks, embedded attenuated phase shift masks ("EAPSM") and alternating aperture phase shift masks ("AAPSM"). These types of phase shift masks are characterized by design features including opaque regions and partially transparent regions through which the phase of light is shifted by, for example, approximately 180°. Examples of such photomasks are described in U.S. Pat. No. 6,682,861, U.S. Patent Publication No. 2004-0185348 A1, U.S. Patent Publication No. 2005-0026053 and U.S. Patent Publication No. 2005-0053847 to Photronics, Inc., the contents of which are incorporated by reference herein.

The process of manufacturing a photomask involves many steps and can be time consuming. In this regard, to manufacturer a photomask, the desired pattern of opaque material 12 to be created on the photomask 10 is typically defined by an electronic data file loaded into an exposure system which typically scans an electron beam (E-beam) or laser beam in a raster or vector fashion across the blank photomask. One such example of a raster scan exposure system is described in U.S. Pat. No. 3,900,737 to Collier. Each unique exposure system has its own software and format for processing data to instruct the equipment in exposing the blank photomask. As the E-beam or laser beam is scanned across the blank photomask 10, the exposure system directs the E-beam or laser beam at addressable locations on the photomask as defined by the electronic data file. The areas of the photosensitive resist material that are exposed to the E-beam or laser beam become soluble while the unexposed portions remain insoluble.

In order to determine where the e-beam or laser should expose the photoresist 14 on the blank photomask 10, and where it should not, appropriate instructions to the processing equipment need to be provided, in the form of a jobdeck. In order to create the jobdeck the images of the desired pattern are broken up (or fractured) into smaller standardized shapes, e.g., rectangles and trapezoids. The fracturing process can be very time consuming. After being fractured, the image may need to be further modified by, for example, sizing the data if needed, rotating the data if needed, adding fiducial and internal reference marks, etc. Typically a dedicated computer system is used to perform the fracturing and/or create the jobdecks. The jobdeck data must then be transferred to the processing tools, to provide such tools with the necessary instructions to expose the photomask.

After the exposure system has scanned the desired image onto the photosensitive resist material 14, as shown in FIG. 2, the soluble photosensitive resist material is removed by means well known in the art, and the unexposed, insoluble photosensitive resist material 14' remains adhered to the opaque material 13 and 12. Thus, the pattern to be formed on the photomask 10 is formed by the remaining photosensitive resist material 14'.

The pattern is then transferred from the remaining photoresist material 14' to the photomask 10 via known etch processes to remove the antireflective material 13 and opaque materials 12 in regions which are not covered by the remaining photoresist 14'. There is a wide variety of etching processes known in the art, including dry etching as well as wet etching, and thus a wide variety of equipment is used to perform such etching. After etching is complete, the remaining photoresist material 14' is stripped or removed and the photomask is completed, as shown in FIG. 3. In the completed photomask, the pattern as previously reflected by the remaining antireflective material 13' and opaque materials 12' are located in regions where the remaining photoresist 14' remain after the soluble materials were removed in prior steps.

In order to determine if there are any unacceptable defects in a particular photomask, it is necessary to inspect the photomask. A defect is any flaw affecting the geometry. This includes undesirable chrome areas (chrome spots, chrome extensions, chrome bridging between geometry) or unwanted clear areas (pin holes, clear extensions, clear breaks). A defect can cause the circuit to be made from the photomask not to function. The entity ordering the photomask will indicate in its defect specification the size of defects that will affect its process. All defects of that size and larger must be repaired, or if they cannot be repaired, the mask must be rejected and rewritten.

Typically, automated mask inspection systems, such as those manufactured by KLA-Tencor or Applied Materials, are used to detect defects. Such automated systems direct an illumination beam at the photomask and detect the intensity of the portion of the light beam transmitted through and reflected back from the photomask. The detected light intensity is then compared with expected light intensity, and any deviation is noted as a defect. The details of one system can be found in U.S. Pat. No. 5,563,702 assigned to KLA-Tencor.

After passing inspection, a completed photomask is cleaned of contaminants. Next, a pellicle may be applied to the completed photomask to protect its critical pattern region from airborne contamination. Subsequent through pellicle defect inspection may be performed. In some instances, the photomask may be cut either before or after a pellicle is applied.

Before performing each of the manufacturing steps described above, a semiconductor manufacturer (e.g., customer) must first provide a photomask manufacturer with different types of data relating to the photomask to be manufactured. In this regard, a customer typically provides a photomask order which includes various types of information and data which are needed to manufacture and process the photomask, including, for example, data relating to the design of the photomask, materials to be used, delivery dates, billing information and other information needed to process the order and manufacture the photomask.

A long standing problem in the manufacture of photomasks is the amount of time it takes to manufacture a photomask from the time a photomask order is received from a customer. In this regard, the overall time it takes to process a photomask order and manufacture a photomask can be lengthy, and thus, the overall output of photomasks is not maximized. Part of this problem is attributable to the fact that many customers who order photomasks often place their orders in a variety of different formats which are often not compatible with the photomask manufacturer's computer system and/or manufacturing equipment. Accordingly, the photomask manufacturer is often required to reformat the order data and condition, convert, and/or supplement it to a different format which is compatible with its computer system and/or manufacturing equipment, which can take a great deal of time, and thus, delay the time it takes to manufacture a photomask.

In an attempt to address these problems, the photomask industry has developed various standard photomask order formats in which photomask orders should be placed. For example, the SEMI P-10 standard is one standard format used in the manufacture of photomasks. Additionally, a few semiconductor manufacturers have developed their own proprietary photomask order format in which photomask orders are to be placed, rather than adopting a standard format. These standard and proprietary photomask order formats were created so that photomask orders would be received from customers in a uniform format, thereby reducing the overall time it takes to manufacture a photomask.

Although such standard and/or proprietary photomask order formats are useful in reducing the time it takes to manufacture photomasks, many semiconductor manufacturers have been reluctant to place their photomask orders in such standard and/or proprietary formats for a variety of reasons. For example, the SEMI P-10 standard order format is quite complicated and requires the customer placing the order to have a sophisticated working knowledge of the requirements associated with such standard. Since many semiconductor manufacturers do not manufacture photomask, such manufacturers may not have the resources, time or ability to learn the intricacies of such standard format. Thus, semiconductor manufacturers often provide a photomask manufacturer with photomask order data in an unorganized and often incomplete manner. As a result, the photomask manufacturer is required to parse through this data and organize it in a useful format (e.g., in the SEMI P-10 format). Additionally, in those instances where incomplete photomask order data is provided to a photomask manufacturer, such manufacturer will be required to request the missing information from the customer. As a result, a great deal of time is often wasted in the process of obtaining a complete and accurate photomask order, and thus, the overall time that it takes to manufacturer a photomask can be greatly delayed. While others have attempted to address these problems through the use of automated systems. However, these prior systems have had several drawbacks.

For example, in the past, AlignRite Corporation (a predecessor organization to Photronics, Inc.), attempted to expedite the delivery of the electronic data through the use of an Internet based delivery system. However, although the AlignRite System was capable of rapid delivery of the photomask data from a customer to the computer system of the photomask manufacturer and was capable of validating the accuracy of this data in real time, this prior system did not provide for the automated generation of photomask order data in a single standard and/or proprietary format. In this regard, once the data was received from the customer, standard modifications to the data would also have to be entered manually by operators. Each time a manual change would have to be entered, the risk of human error increased and the overall length of the job would be extended.

Since then, others have disclosed systems in which manufacturing and billing data are down-loaded over the Internet and verified on-line automatically. One such system is described in PCT Publication Number 02/03141, published on Jan. 10, 2002 to DuPont Photomask, Inc. which is also the subject of U.S. Pat. No. 6,622,295. More particularly, the DuPont PCT Publication discloses a system in which photomask order data is entered on-line by a customer and transmitted to a photomask manufacturer for processing. In this system, a customer is prompted to enter photomask order data. Such data is transmitted to a photomask manufacturer, which in turn performs a diagnostic evaluation of the data. If any data is incomplete or inaccurate, the system sends a message to the customer notifying him of such error. Thereafter, the user must correct the error. After the data has been validated by the manufacturer (and corrected when necessary), the manufacturer processes this data and puts it into a standard (or proprietary) format, such as the SEMI P-10 standard format.

Although useful for diagnostic purposes, the system of the DuPont PCT Publication is very cumbersome and provides a user with very little flexibility in formulating a photomask order depending upon the customer whose data is being entered. The DuPont system provides for no profiling of a customer's information based on the entry of generic information. Another disadvantage of DuPont's system is that a customer is required to reenter specific information regarding the order each time the customer uses the system and can not use the information entered in previous orders. Thus, using the DuPont system to generate a photomask order is time-consuming.

In the prior art, once a photomask order was received from a customer and put into a proper format, it was still necessary to process that order so that the photomask could be written by the relevant manufacturing equipment and inspected by the relevant manufacturing equipment. In a typical photomask production process, many of the steps necessary to form a completed photomask are performed manually or by separate individuals. As a result, the prior known methods and systems for performing these steps are inefficient, time consuming and subject to a great deal of human error.

More particularly, once the manufacturer receives a customer's photomask order, operators are required to sort through the information received and manually forward the same to the appropriate processing station or department the information provided. For example, the billing information would have to be forwarded to the billing department, and pattern data necessary to perform the fracturing needs to be provided to the fracturing computer, and the remaining jobdeck information would have to be forwarded to the appropriate processing station. If information is provided in a different format than the manufacturers computer provides, this fact would also need to be identified manually, and then the file converted to an appropriate format. If the photomask manufacturer desired to track the progress of the photomask in production, it was necessary to individually contact each station and ascertain the status from the operator. To the extent that the semiconductor manufacturer needs the same pattern to be used by multiple different machines, an operator is required to manually program the fracturing computer to make appropriate modifications. Similarly, to the extent certain customer's specified format needs to be modified due to photomask manufacturing processes being used, these types of modifications of data input to the fracturing computer also heretofore needed to be entered manually by an operator. The prior art systems provide no way to automatically account and handle these variations.

A long-standing problem in the photomask production industry is how to reduce the time it takes from receipt of a customer order to formation and delivery of the processed photomask. Some ways used in the past to expedite this process has been the creation of industry standards, such as the SEMI P10 standard which has been modified and updated over the years, which dictate the form in which data should be electronically provided to photomask manufacturers. While such standards are helpful, they have not in and of themselves achieved a seamless automation of the processing of information necessary in the manufacture of the photomasks.

After the manufacturing steps described above are completed, the completed photomask is sent to a customer for use to manufacture semiconductor and other products. In particular, photomasks are commonly used in the semiconductor industry to transfer micro-scale images defining a semiconductor circuit onto a silicon or gallium arsenide substrate or wafer. The process for transferring an image from a photomask to a silicon substrate or wafer is commonly referred to as lithography or microlithography. Typically, as shown in FIG. 4, the semiconductor manufacturing process comprises the steps of deposition, photolithography, and etching. During deposition, a layer of either electrically insulating or electrically conductive material (like a metal, polysilicon or oxide) is deposited on the surface of a silicon wafer. This material is then coated with a photosensitive resist. The photomask is then used much the same way a photographic negative is used to make a photograph. Photolithography involves projecting the image on the photomask onto the wafer. If the image on the photomask is projected several times side by side onto the wafer, this is known as stepping and the photomask is called a reticle.

As shown in FIG. 5, to create an image 21 on a semiconductor wafer 20, a photomask 10 is interposed between the semiconductor wafer 20, which includes a layer of photosensitive material, and an optical system 22. Energy generated by an energy source 23, commonly referred to as a Stepper, is inhibited from passing through the areas of the photomask 10 where the opaque material is present. Energy from the Stepper 23 passes through the transparent portions of the quartz substrate 11 not covered by the opaque material 12 and the antireflective material 13. The optical system 22 projects a scaled image 24 of the pattern of the opaque material 12 and 13 onto the semiconductor wafer 20 and causes a reaction in the photosensitive material on the semiconductor wafer. The solubility of the photosensitive material is changed in areas exposed to the energy. In the case of a positive photolithographic process, the exposed photosensitive material becomes soluble and can be removed. In the case of a negative photolithographic process, the exposed photosensitive material becomes insoluble and unexposed soluble photosensitive material is removed.

After the soluble photosensitive material is removed, the image or pattern formed in the insoluble photosensitive material is transferred to the substrate by a process well known in the art which is commonly referred to as etching. Once the pattern is etched onto the substrate material, the remaining resist is removed resulting in a finished product. A new layer of material and resist is then deposited on the wafer and the image on the next photomask is projected onto it. Again the wafer is developed and etched. This process is repeated until the circuit is complete. Because, in a typical semiconductor device many layers may be deposited, many different photomasks may be necessary for the manufacture of even a single semiconductor device. Indeed, if more than one piece of equipment is used by a semiconductor manufacturer to manufacture a semiconductor device, it is possible more than one photomask may be needed, even for each layer. Furthermore, because different types of equipment may also be used to expose the photoresist in the different production lines, even the multiple identical photomask patterns may require additional variations in sizing, orientation, scaling and other attributes to account for differences in the semiconductor manufacturing equipment. Similar adjustments may also be necessary to account for differences in the photomask manufacturer's lithography equipment. These differences need to be accounted for in the photomask manufacturing process.

SUMMARY OF THE INVENTION

While the prior art is of interest, the known methods and apparatus of the prior art present several limitations which the present invention seeks to overcome.

In particular, it is an object of the present invention to provide a comprehensive front-end method and system for generating and processing photomask orders.

It is another object of the present invention to provide a rule-based system and method for automatically generating a photomask order into one or more standard and/or proprietary formats, wherein the rules can be adapted or modified to meet any number of different standard and/or proprietary formats now known or hereinafter developed.

It is another object of the present invention to provide a rule-based system and method for automatically generating a photomask order into one or more standard and/or proprietary formats, wherein the system and method requires a user to follow a set of rules associated with a standard and/or proprietary format for photomask orders.

It is another object of the present invention to provide a rule-based system and method for automatically generating a photomask order into one or more standard and/or proprietary formats, wherein an order is generated by merging existing photomask order(s) and/or templates containing photomask data into a single, new order.

It is another object of the present invention to provide a rule-based photomask order system and method for reducing photomask order and data entry times.

It is another object of the present invention to provide a rule-based photomask order system and method for increasing the overall output of photomasks being manufactured.

It is another object of the present invention to provide a rule-based photomask order system and method for reducing transcription errors associated with the manual entry of photomask orders.

It is another object of the present invention to eliminate manual intervention in the transmission and processing of photomask order data for manufacture of a photomask.

It is another object of the present invention to reduce the lead time and total processing time it takes from the time that a photomask manufacturer receives the necessary processing information from a front-end photomask processor to the time it takes to deliver the finished photomask to that front-end photomask processor.

It is another object of the present invention to improve the accuracy and efficiency in which photomask data is processed and transmitted for manufacture.

It is another object of the present invention to solve the shortcomings of the prior art.

Other objects will become apparent from the foregoing description.

It has now been found that the above and related objects of the present invention are obtained in the form of a front-end method and system for automatically generating and processing at least a portion of photomask orders in a substantially ready-to-write format and a substantially ready-to-inspect format.

More particularly, the present inventions relates to a method of processing mask data by converting design data in the form of an electronic circuit design data file for use in manufacturing a photomask having substantially transparent and substantially opaque features into a data format suitable for a specific photomask manufacturing processing. This method comprises the following steps: entering the design data using a specific form of the electronic circuit design data; inputting requirements for processing an order for a photomask made in accordance with the design data; sizing the design data to facilitate process movement of the substantially transparent and substantially opaque features in the photomask; fracturing at least a portion of the design data into a substantially ready-to-write format compatible with the specific photomask manufacturing processing; verifying the integrity of the fractured design data; merging two or more sets of data generated from one or more of the following data types: (i) the entered design data; (ii) the sized design data; (iii) the fractured data; and (iv) the verification of the fractured data; conditioning the data set to be compatible with the mask manufacturing process; and sending electronic signals corresponding to the conditioned data set to a remote manufacturing system associated with the specific photomask manufacturing processing.

Similarly, the present invention is directed to a method of processing mask data by converting design data in the form of an electronic circuit design data file for use in manufacturing a photomask having phase shifting and substantially opaque features into a data format suitable for a specific photomask manufacturing processing. This method comprises the steps of: entering the design data using a specific form of the electronic circuit design data; inputting requirements for processing an order for a photomask made in accordance with the design data; applying optical proximity correction to facilitate process movement of the phase shifting and substantially opaque features in the photomask; fracturing at least a portion of the design data into a substantially ready-to-write format compatible with the specific photomask manufacturing processing; verifying the integrity of the fractured design data; merging two or more sets of data from one or more of the following data types: (i) the entered design data; (ii) the sized design data; (iii) the fractured data; and (iv) the verification of the fractured data; conditioning the data set to be compatible with the mask manufacturing process; and sending electronic signals corresponding to the conditioned data set to a remote manufacturing system associated with the specific photomask manufacturing processing.

Additionally, the present invention is directed to an automated system for processing mask data by converting design data in the form of an electronic circuit design data file for use in manufacturing a photomask having substantially transparent and substantially opaque features into a data format suitable for a specific photomask manufacturing processing, comprising a computer readable medium containing instructions. These instructions are executable on a processor capable of performing the following steps: entering the design data using a specific form of the electronic circuit design data; inputting requirements for processing an order for a photomask made in accordance with the design data; sizing the design data to facilitate process movement of the substantially transparent and substantially opaque features in the photomask; fracturing at least a portion of the design data into a substantially ready-to-write format compatible with the specific photomask manufacturing processing; verifying the integrity of the fractured design data; merging two or more sets of data from one or more of the following data types: (i) the entered design data; (ii) the sized design data; (iii) the fractured data; and (iv) the verification of the fractured data; conditioning the data set to be compatible with the mask manufacturing process; and sending electronic signals corresponding to the conditioned data set to a remote manufacturing system associated with the specific photomask manufacturing processing.

Moreover, the present invention is directed to an automated system for processing mask data by converting design data in the form of an electronic circuit design data file for use in manufacturing a photomask having substantially transparent and substantially opaque features into a data format suitable for a specific photomask manufacturing processing. This system comprises: at least one server comprising a memory, a first software component and a second software component for processing mask data, wherein the data relating to the mask design is stored in the memory, the first software component comprises instructions governing a user's entry of requirements data for processing an order for a photomask made in accordance with the design data, the second software component comprises instructions for parsing mask pattern data and the requirements data into a format suitable for manufacturing, wherein the second software component comprises instructions for carrying out the following tasks: (i) sizing the design data to facilitate process movement of the substantially transparent and substantially opaque features in the photomask; (ii) fracturing at least a portion of the design data into a substantially ready-to-write format compatible with the specific photomask manufacturing processing; (iii) verifying the integrity of the fractured design data; (iv) merging two or more sets of data from one or more of the following data types: (a) the entered design data; (b) the sized design data; (c) the fractured data; and (d) the verification of the fractured data; (v) conditioning the data set to be compatible with the mask manufacturing process; and circuitry for sending electronic signals corresponding to the conditioned data set to a remote manufacturing system associated with the specific photomask manufacturing processing.

Further, the present invention is directed to an automated system for processing mask data by converting design data in the form of an electronic circuit design data file for use in manufacturing a photomask having phase sifting and substantially opaque features into a data format suitable for a specific photomask manufacturing processing, comprising a computer readable medium containing instructions. These instructions are executable on a processor capable of performing the following steps: entering the design data using a specific form of the electronic circuit design data; inputting requirements for processing an order for a photomask made in accordance with the design data; applying optical proximity correction to facilitate process movement of the phase shifting and substantially opaque features in the photomask; fracturing at least a portion of the design data into a substantially ready-to-write format compatible with the specific photomask manufacturing processing; verifying the integrity of the fractured design data; merging two or more sets of data from one or more of the following data types: (i) the entered design data; (ii) the sized design data; (iii) the fractured data; and (iv) the verification of the fractured data; conditioning the data set to be compatible with the mask manufacturing process; and sending electronic signals corresponding to the conditioned data set to a remote manufacturing system associated with the specific photomask manufacturing processing.

The present invention is also directed to an automated system for processing mask data by converting design data in the form of an electronic circuit design data file for use in manufacturing a photomask having phase sifting and substantially opaque features into a data format suitable for a specific photomask manufacturing processing. The system comprises: a least one server comprising a memory, a first software component and a second software component for processing mask data, wherein the data relating to the mask design is stored in the memory, the first software component comprises instructions governing a user's entry of requirements data for processing an order for a photomask made in accordance with the design data, the second software component comprises instructions for parsing mask pattern data and the requirements data into a format suitable for manufacturing, wherein the second software component comprises instructions for carrying out the following tasks: (i) applying optical proximity correction to facilitate process movement of the phase shifting and substantially opaque features in the photomask; (ii) fracturing at least a portion of the design data into a substantially ready-to-write format compatible with the specific photomask manufacturing processing; (iii) verifying the integrity of the fractured design data; (iv) merging two or more sets of data from one or more of the following data types: (a) the entered design data; (b) the sized design data; (c) the fractured data; and (d) the verification of the fractured data; (v) conditioning the data set to be compatible with the mask manufacturing process; and circuitry for sending electronic signals corresponding to the conditioned data set to a remote manufacturing system associated with the specific photomask manufacturing processing.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF THE PREFERRED EMBODIMENT(S)

The present invention relates to a comprehensive front-end method and system for automatically generating and processing photomask orders. This method and system includes two separate, but related software components. The first software component of the present invention is used to generate a photomask order in a specified format. The second software component of the present invention processes at least a portion of the photomask order (which was generated using the first software component or otherwise substantially ready-to-write jobdeck file and/or a substantially ready-to-write inspection file, which in turn is transferred to a remote photomask manufacturer's system to manufacture a photomask. These software components can be installed as separate programs on a computer system or operate as a single software package performing multiple functions. The general process flow of the system and method of the present invention is described with reference to FIG. 6 and the details of this system and method are described with reference to FIGS. 7-12.

Figure 1:
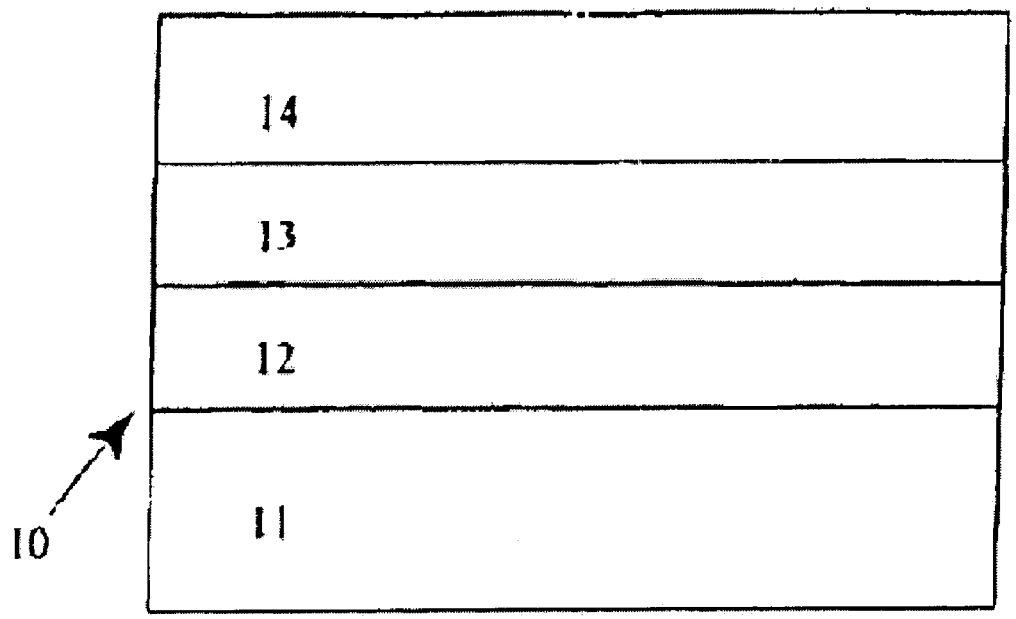
FIG. 1 represents a blank or undeveloped photomask of the prior art.
Figure 2:
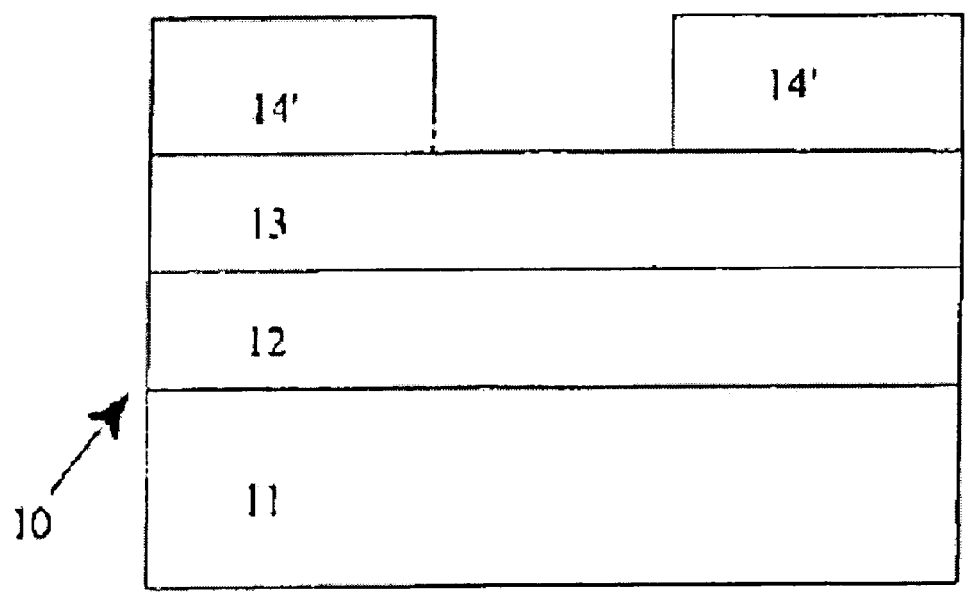
FIG. 2 represents the photomask of FIG. 1 after it has been partially processed.
Figure 3:
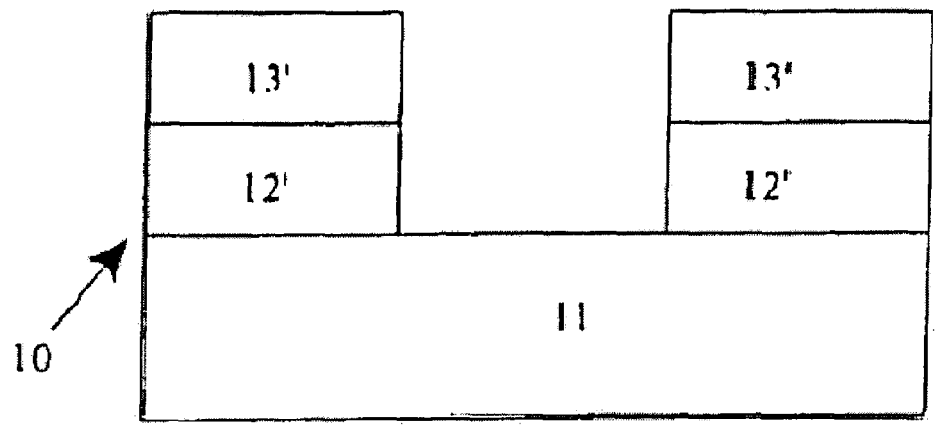
FIG. 3 represents the photomask of FIGS. 1 and 2 after it has been fully processed.
Figure 4:
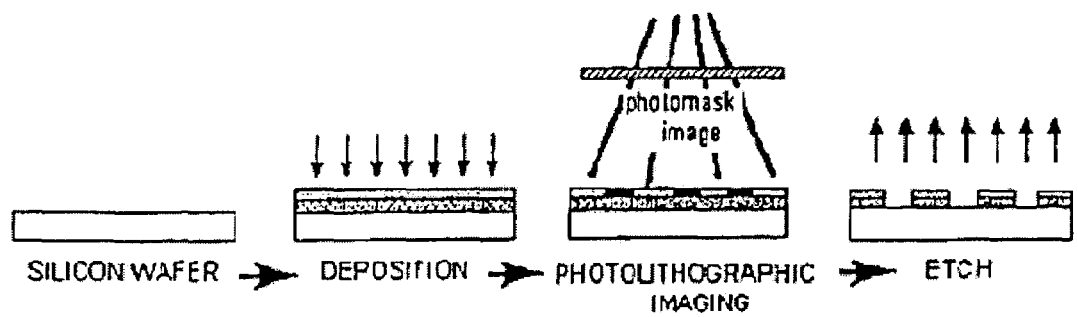
FIG. 4 is a flowchart showing the method of using a processed photomask to make or process a semiconductor wafer.
Figure 5:
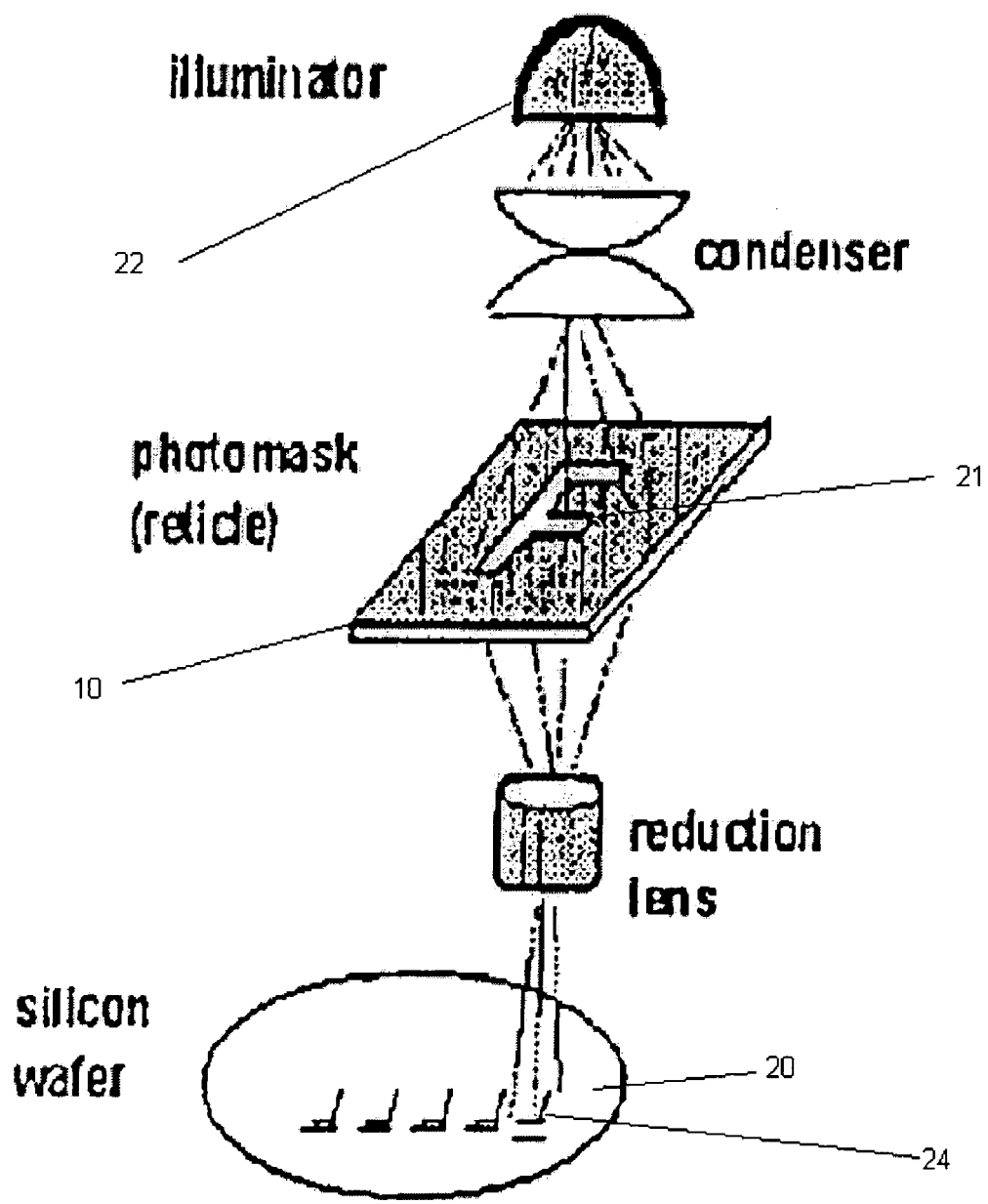
FIG. 5 shows the process of making a semiconductor using a wafer stepper.
Figure 6:
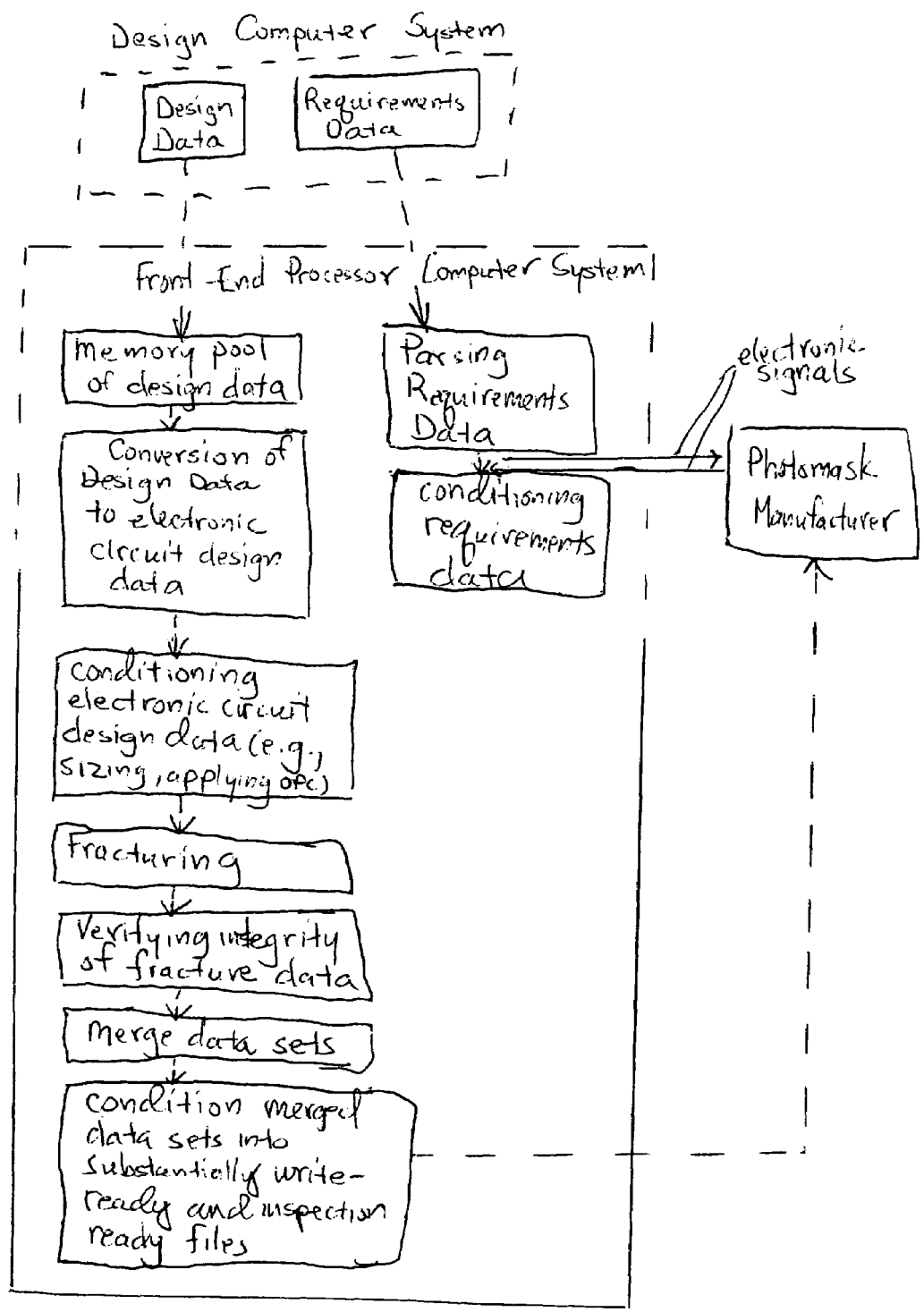
FIG. 6 shows the general process flow for generating and processing photomask orders in accordance with the present invention.

Referring to FIG. 6, photomask design data and manufacturing process requirements data are obtained from an entity (e.g., from a semiconductor designer's computer system) desiring to order a photomask. The exemplary semiconductor designer's computer system may either be part of or separate from the front-end processor's computer network. If it is remotely connected, it may either be connected through an FTP connection, a secured internet connection, a data service network (as described below) or other known or future developed techniques, to name a few. The first component of the software of the present invention is installed on a photomask order processor's computer system and is used to input and condition the manufacturing process requirements data in a specified format (e.g., SEMI P-10). In a preferred embodiment, the second component of the software of the present invention is also installed on the same system as the first software component. Alternatively, the second software component can be installed on a separate computer system which can communicate with the first component as the first computer system through, for example, a network connection, a data service network, as discussed below.

The second software component of the present invention receives the photomask design data which has already been entered on the system as an electronic file. Thereafter, the second software component processes the received design data and requirements data. In this regard, the second software component: (i) sizes the design data for binary photomask designs or performs optical proximity correction to the design data for phase shift mask designs; (ii) fractures the design data; (iii) verifies the integrity of the fractured data; (iv) merges data sets created during processing of the design data requirements data; and (v) conditions that merged data sets into substantially ready-to-inspect and/or ready-to-write data files. Once these steps are completed, the conditioned data is sent by an electronic signal (e.g., e-mail) to a photomask manufacturer for processing. In one embodiment, prior to completion of these steps, an electronic signal (e.g., an e-mail) is sent to the manufacturer advising that a photomask order is being entered and requesting from the manufacturer information pertaining to the manufacturing facility and related equipment to be used to make the photomask. The manufacturer, in turn, will transmit an electronic signal to photomask processor's system providing this information. This information will be taken into account in finalizing the data for manufacture. Although in the preferred embodiment the above steps are performed in the order shown in FIG. 6, it should be understood that the present invention and appended claims are not limited to these order of steps, which can be modified to meet the needs of a particular order and manufacturing process.

Before describing the software components and related method of the present invention, it is first necessary to describe the type of information needed to create a photomask order and manufacture a photomask in accordance with that order. More particularly, as discussed herein, a photomask is typically required to manufacture a semiconductor and other devices. As is often the case, before a photomask is manufactured, the entity desiring the photomask must first design the photomask to be manufactured. To do so, this entity will develop certain data and specifications to be provided to the photomask manufacturer. More specifically, this entity will generate on its computer: (1) pattern data; and (2) other specific requirements relating to the specific job, which are often provided in an industry standard format such as the SEMI P-10 form, but may be provided in other custom formats.

Pattern data is typically generated in the form of a drawing and typically shows the various shapes and lines to be included on a photomask. The pattern data, however, is not necessarily to scale. In other words, the pattern data does not necessarily include the necessary specifications corresponding to the pattern data, including, but not limited to information such as the critical dimensions of the pattern, the shades of color to be used in different regions of the pattern, the registration information, actual placement of the pattern of the mask, exposure information, inspection information, to name a few. Rather, the pattern data only shows the overall shape of the pattern to be etched on a photomask. The pattern data can be provided in any electronic format which can be parsed.

Accordingly, in addition to providing pattern data, the entity designing the photomask also provides additional necessary information to the manufacture in order to perform the processing steps, typically in the SEMI P-10 form. The SEMI P-10 is a data structure specification intended to facilitate the transmittal of photomask order data between software systems to allow the automatic processing of such orders by photomask manufacturers. The SEMI P-10 form, which has been revised over the years, includes such information as, for example, customer information, critical dimension information, tone information, registration information, billing information, format codes for the pattern information being separately provided, dimension and scale factors for the completed photomask, fracturing scale, substrate and pellicle types, to name a few. The SEMI-P10-0301 standard, as well as its predecessors, are incorporated herein by reference as examples of identifying the type of information that could be included in the data transfer from a customer to a photomask manufacturer. For ease of reference, the non-pattern information which is electronically provided is referred to herein as a photomask order. It should be noted, however, that the present invention is not limited to the current version of the SEMI P-10 standard and could be easily modified to conform to any future changes in such standard. Further, the present invention is not limited to even standard formats and can also be applied to custom formats which also for ease of reference are referred to herein as a photomask order. According to the present invention, the first software component and related method are used to guide the user the order entry process so as generate an order in a particular format.

More particularly, according to the present invention, a computerized rule-based system and method is provided for automatically generating photomask orders in a specified format, wherein an entity desiring to have a photomask manufactured (hereinafter referred to as a "front-end photomask processor") is guided through the process of entering order data required to manufacture the photomask such that the data is complete and accurate and meets the requirements of a specified order format. Examples of a front-end photomask processor include, but are not limited, a photomask designer, semiconductor manufacturer, a customer of a photomask manufacturer, to name a few.

To carry out these functions, the system and method utilize a first software component which includes combination of one or more of the following five sub-components to generate a photomask order into a desired format: (1) templates in which data is entered; (2) rules for converting the data entered in the templates into a specified standard and/or proprietary format; (3) a method for using templates to create a photomask order in a specified format; (4) a separate set of rules for validating photomask order against a specified standard format; and (5) specification grades which are one or more unique attribute objects associated with a photomask template or order and may be referenced by a template or order.

Software is implemented in the system of the present invention to associate specific templates with specific rules to ensure that a front-end photomask processor enters complete and accurate photomask order information. Likewise, software is implemented in the system of the present invention to associate specific photomask orders with specific rules to ensure that the front-end photomask processor enters complete and accurate photomask order information. The specification grades can be treated as reference data and can be applied to a template, order, or template used to create an order. By having templates and orders include specification grades as reference data, one may easily update a large number of templates and/or orders by merely revising only a small number of specification grades.

Before describing this software, it is first necessary to describe the manner in which the templates, orders and rules are stored and organized. More particularly, the system includes a server including at least one processor and an external data storage media stored on the server. Rules and templates for facilitating the entry of photomask order data and for generating an order are stored in the external storage media. The external data storage media may be a variety of different types of storage media, including, but not limited to, a relational database, an object-oriented class, an XML file and other similar storage media now known or hereinafter developed. By maintaining the storage media external to the system and by providing flexibility in the type of storage media that can be used with the system and method of the present invention, a variety of different users and automated systems may operate the system dynamically across a variety of different platforms.

In a preferred embodiment, a set of templates and orders are created based on the requirements of a particular standard and/or proprietary photomask order format. In this regard, the templates and orders are organized as a hierarchy of components and subcomponents, wherein each component and subcomponent is defined by the requirements of a particular standard and/or proprietary photomask order format. For example, a particular photomask order format may require that the mask data component include certain subcomponents, such as a title, barcode and pattern data, to name a few. Each of these subcomponents may have further detailed subcomponents ("child component"). For example, the pattern data component, which is a subcomponent of the mask data component, may have a set of child components associated therewith. Depending upon the requirements of the standard and/or proprietary photomask order format, these child components may have additional subcomponents as well, which can in turn, have their own subcomponents and so forth and so on.

Each of the components and their associated subcomponents is defined by a set of attributes (e.g., binary, string, integer, real number, date, Boolean, list, etc.). Since templates are used to create photomask orders, the rules (discussed in more detail below) associated with any given template are a subset of the rules associated with the photomask order that is created from the template. Under the present invention, templates, orders, components, subcomponents, etc. may each be stored separately. This will allow the user to leave certain components or subcomponents out of a template and have these separately stored components or subcomponents referenced by the template as specification grades. In the event new order created from the given template requires changes in these components or subcomponents, one only needs to make changes to the separately stored specification grades without having to make any changes to the template.

Table 1 demonstrates an example of how the components and subcomponents of the templates and orders may be organized according to a standard and/or proprietary photomask order format:

TABLE 1

| Order | Supplied Pattern Data | | | |
|---|---|---|---|---|
| | Pattern Group | Pattern Placement | | |
| | Mask Data | Title | | |
| | | Barcode | | |
| | | OPC Definition | | |
| | | Array | | |
| | | Registration | | |
| | | Measure File Registration | | |
| | | Die to Data Inspection | | |
| | | Die to Die Inspection | | |
| | | Surface Definition | | |
| | | Visual Inspection | | |
| | | Pattern | Critical Dimension | |
| | | | Die to Die Inspection | |
| | | | Die to Data Inspection | |
| | | Field | Pattern | Critical Dimension |
| | | | | Die to Die Inspection |
| | | | | Die to Data Inspection |

In Table 1, the entry in the first (left-most) column is a parent of the entry in the second column (child), and the entry in the second column is a parent of the entry in the third column, and so on. Alternatively, any two adjacent columns in Table 1 may define components (left column) and subcomponents (right column). As illustrated in Table 1, the same components may appear as subcomponents to other components. For example, Critical Dimension data appears as a subcomponent to Pattern data in column 4 and column 5 of Table 1. Since each component and its associated subcomponents may be stored separately from each other and from an order or a template, any of them may also be copied from one portion of an order to another portion of the same order or a different order, template, component, subcomponent, etc. This flexibility in copying and pasting components and subcomponents allows a user to quickly create many photomask orders without having to re-enter the same order information.

Figure 8:
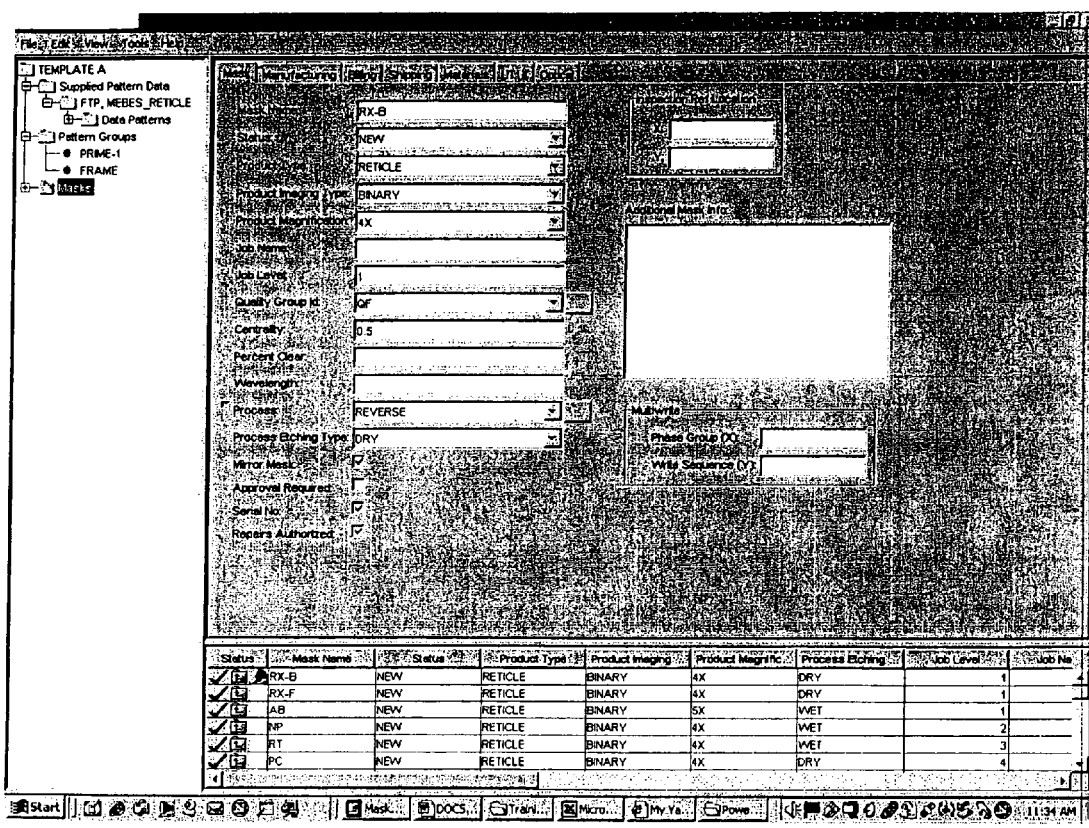
FIG. 8 shows an example of a graphical user interface used with the invention to guide a user to enter specified data.

Templates and orders may be created manually using a graphical user interface. Templates and orders may also be automatically created or modified using information from other, external media, including, but not limited to, non-formatted text files, XML files, or some type of data storage device or mechanism. For example, a front-end photomask processor's computer may include such files, databases or other electronic information that would be useful in creating a new template or order or providing missing information for an existing template or order. A data-processing mechanism may be used to import necessary information from these external media into new or existing templates or orders. For example, a translation or mapping software could be used to convert the front-end photomask processor's files or databases into a format which would be needed for the application. A commercially available example of such software is Data Junction, a visual design tool for rapidly integrating and transforming data between hundreds of applications and structured data formats. However, any appropriate commercial or proprietary translation or mapping software could be used to accomplish this task. The external information may be imported into the templates or orders either locally to the order processing system, or via an existing network connection, like a wide area network or local area network or internet, etc. They may also be accepted by other known techniques such as FTP protocol, e-mail, http, proprietary protocols, or any other known protocols that may be available to transfer the information. When a GUI is used, a user may be prompted by the GUI to enter specifically enumerated data. FIG. 8 is a typical GUI that can be used by a photomask order generating system. In this example, the GUI shown in FIG. 8 prompts the user to enter descriptive information relating to the mask to be ordered. In this example, information including mask name, status, product type, to name a few is entered. In some instances such as with mask name the information is directly typed in. In other instances, the information may be selected from a drop down menu, such as the case with the product type category.

Templates and orders may also be automatically created or modified using information from other, external media, including, but not limited to, non-formatted text files, XML files, or some type of data storage device or mechanism. For example, a front-end photomask processor's computer may include such files, databases or other electronic information that would be useful in creating a new template or order or providing missing information for an existing template or order. Similarly, an order template, component, subcomponent, etc. may be imported electronically by, for example, a scanner, or other file conversion technique such that a pre-existing order, template, component or subcomponent could be converted and reformatted for use by the photomask order generating system. For example, a translation or mapping software could be used to convert the front-end photomask processor's files or databases into a format which would be needed for the application. A commercially available example of such software is Data Junction, a visual design tool for rapidly integrating and transforming data between hundreds of applications and structured data formats. However, any appropriate commercial or proprietary translation or mapping software could be used to accomplish this task. The external information may be imported into the templates or orders either locally through the order processing system, or via an existing network connection, such as a wide area network or local area network or the internet, etc., by various data transfer techniques such as FTP protocol, e-mail, http, proprietary protocols, or any other known protocols.

All operations performed by a person via a graphical user interface may also be performed, at least in part, in an automated manner without direct human interaction. Under the present invention, this can be achieved by the scripting technique based on a plain-text instruction set or command line. A plain text instruction set is a high level programming language which can be interpreted into the application programming interface to instruct the application to perform a series of operations. For example, a command line stating "replace device name 'Device A' with device name 'Device B'" could be sent to the system by a user at the front-end photomask processor's network, or automatically as detailed herein. When the system receives this command line, it would replace the device name in a specific template or order with the new device name. Of course, this is merely one example of how an instruction set could be used, and is not meant to be limiting within the scope of the present invention. Custom modules may be created for use on the front-end photomask processor's system to access this instruction using any programming language capable of producing an ASCII or binary file and executing an operating system command. Automated implementation will allow access by authorized users to any authorized system via an existing network connection. Typical security measures such as firewalls, log-ins, passwords, etc. can be used to protect the confidentiality and data security of the database and mask ordering system.

Thus, orders, templates, components, subcomponents, etc. may be generated and/or modified by using the scripting technique via a command line or some other development environment. Preferably, the scripting technique involves a command-line program which takes as an argument the name of a script entered by a user that contains a number of commands to manipulate orders, templates, components and/or subcomponents, etc. in some specified manner. Preferably, some or all of the editing functionality that is available to the user via a graphical user interface can also be made available in the scripting technique via script commands.

In a preferred embodiment, script commands may be used for such editing functions as creating new orders, editing existing orders, creating orders from templates, adding new components or subcomponents to an order, template, components, or subcomponents, modifying components or subcomponents, saving orders, creating SEMI P-10 files or files in other comparable format or standard from orders, to name a few. In addition, the scripting technique could be made capable of querying data and making batch edits to multiple orders and templates at the same time.

A script file used in the scripting technique may be in the form of a plain text file that contains one or more script commands. A script command may include such functions as variable declaration, assignment, function call, if-statement, for- or for each-statement, while-statement, and include, to name a few. The variable declaration command is used to declare, before its use, a variable to be used to store a data value for later use. The variable declaration command may comprise a declaration of a data type of the variable to be used. The data type of a variable may be one of the followings: string, number, Boolean, date, list, treeitem. A string may represent a sequence of zero or more characters. A number may represent either a whole or fractional number of any practical size which may be either positive, zero, or negative. A Boolean may represent either true or false. A date may represent a specific day and may also include time of the day. A list may represent a list of values of the same data type. A treeitem may represent an object from the tree hierarchy of the photomask ordering system, such as an order, a photomask, a template, or a pattern, etc.

With the function call command, a call can be made to a function in the system library. Functions that can be called from the system library may include the functions for the general management of orders, templates, components, and subcomponents, the functions for dealing with individual treeitems, the functions for dealing with the fields of a particular treeitem, the functions for dealing with date values, the functions for manipulating lists of values, and any other general or specific purpose functions.

Examples of the function calls for the general management of orders, templates, components, and subcomponents may include, but are not limited to: create order (to create a new empty order), create order from template (to create a new order from a given template), open order (to open an existing order), create template (to create a new template), open template (to open an existing template for editing), apply date schedule (to apply a given pre-existing date schedule to an order or template starting from a specified date), save (to save the changes to an order template to the database), create SEMI P-10 file (to create a "SEMI P-10" file from a given order), create and send SEMI P-10 file (to create a SEMI P-10 file from a given order and send it via a specified transfer method, e.g., FTP over the internet, to a specified location), delete order (to delete specified order from the database), delete template (to delete a specified template from the database), to name a few.

Examples of the function calls for dealing with individual treeitems may include, but are not limited to: create treeitem (to create a new, blank treeitem of the specified type), copy treeitem (to create an exact copy of a treeitem, including its associated child treeitems), find treeitem (to locate a treeitem of a given type anywhere beneath another treeitem satisfying a certain given criteria), find treeitems (to find all treeitems that meet a certain given criteria), get parent (to obtain the parent treeitem of a given treeitem), replace in tree (to replace a given piece of text in all text fields within the specific types of treeitem starting from a specific object), to name a few.

Examples of the function calls for dealing with the fields of a treeitem may include, but are not limited to: get field (to obtain the value of a treeitem field), set field (to set the value of a treeitem field), add field item (to add a new value to a treeitem field that is of type list), remove field item (to remove an item from a treeitem field of type list), to name a few.

Examples of the function calls for dealing with date values may include, but are not limited to: create date (to create a new date with a specified value), date add (to add the specified time period to a date), date subtract (to subtract the specified time period from a date), to name a few.

Examples of the function calls for manipulating lists of values may include, but are not limited to: add list item (to add a new item to a list, wherein the new item is of the same data type as other items in the list), remove list item (to remove an item from a list), list contains (to determine whether a specific value is contained in a list), list size (to determine the number of items in the list), to name a few.

Examples of the general or special purpose functions may include, but are not limited to: is null (to determine whether a value is a null value), print (to print a message to the screen), to name a few. Whatever type or form of functionality a user may find desirable can potentially be included as functions in a system library. The list of function calls in a system library may be upgraded or revised at any time.

The assignment command assigns a variable with a new value. The if-statement command allows a script to take decisions based on some criteria. The for- or for each-statement command allows for an iteration over some specified list. The while command is generic looping construct. The include command specifies that another script should be run at that point.

Potentially, command lines may appear in any order. However, the order is generally required to follow the logic, since the commands are typically executed in sequence. A command line may or may not be case-sensitive, depending on the preference of the system designer.

Comment lines may be included as text in a script file so as to improve the readability of the script file by explaining in user's native language (e.g., English, Russian, etc.) of what is being done. Typically, when comment lines are included in a script file, that information will be ignored when the script file is executed. Further, a script file may be formatted to allow a user to include white space or blank carriage returns to facilitate the readability of the file without impacting on the execution of the script file.

Once generated, either in whole or in part, in one embodiment of the disclosed system, the orders, templates, components and/or subcomponent may be transferred to or accessed by different users of the system of the present invention, or different systems of the present invention. For example, one user at a front-end photomask processor may e-mail or otherwise transfer a template or order to a different user at that front-end photomask processor or at a different front-end photomask processor so that the transferred template or order could be used to make a new or modified template or order. Of course, such transfer may occur by other methods of transfer such as FTP protocol, or transport on a disk or other storage medium, etc. As a security measure, access codes or other access limiting techniques may be applied to orders, templates, components and/or subcomponents, etc. to prevent unauthorized access and/or modification.

When making a photomask order, front-end photomask processors may not have access to, or knowledge of, all required information to complete an order. In the past, the lack of such information would delay the order completion process and require that such information be manually collected from appropriate sources.

Under one embodiment of the present invention, such information is automatically retrieved, at least in part, from other sources which have the required information and require little, or no input on the part of the front-end photomask processor. For example, in the event that the information required to be entered into an order which are governed by a first set of rules is unavailable to the front-end photomask processor, the data processing mechanism of the present invention can access a data-service that will provide the capability to search for this required information. An example of such a data-service would include ServiceObjects, which enables users to simultaneously access Internet sites, databases, intranets and other internal and external resources as if the content existed in a single location and to package information, such as shipping information, in a format that can be accessed by other programs. In this example, the application would send a data query to the data-service seeking specific shipping options that may be available for the photomask being ordered. The data-service would, in turn, send the requested information back to the application, which would then provide such information to the front-end photomask processor using the application. Other types of data-services could also be applied to such information as logistics, inventories, supply characteristics, equipment availability, run times, tool up time, level loading, capacity information, or any other such information that a front-end photomask processor would desire in order to prepare a specific photomask order. Script commands may also be created to access data through a data service or otherwise.

The data-service may be located either locally on the front-end photomask processor's computer or network, or remotely from the front-end photomask processor's order processing system, and may itself access data from any number or type of remote computer systems (e.g., the logistic vendor's computer system, the parts supplier's computer system, the equipment supplier's computer system, the photomask manufacturer's computer system, etc.) through an interface known to both the application software and the data-service, and can use any number of acceptable protocols, including, for example, SOAP, XML, XML-RPC, ebXML, HTML, etc. The data-service may search (e.g., by query) these remote systems for the information not available to the front-end photomask processor, and if available, retrieve such data. Optionally, the data-service can be configured to verify data, if so desired. The data-service's search mechanism may be configurable based on the user's desired information (e.g., logistics, supply, processing time, etc.) based on any number of possible parameters (e.g., costs, time, front-end photomask processor name, mask size, stepper equipment to be used, etc.) provided by the user's system.

All operations performed by a person via a graphical user interface may also be performed, at least in part, in an automated manner; that is to say without human interaction. The invention may provide access to this functionality via a plain-text instruction set or command line. A plain text instruction set is a high level programming language which can be interpreted into the application programming interface to instruct the application to perform a series of operations. For example, a command line stating "replace device name 'Device A' with device name 'Device B'" could be sent to the system by a user at the front-end photomask processor's network, or automatically as detailed above. When the system receives this command line, it would replace the device name in a specific template or order with the new device name. Of course, this is merely one example of how an instruction set could be used, and is not meant to be limiting within the scope of the present invention. Custom modules may be created for use on the front-end photomask processor's system to access this instruction using any programming language capable of producing an ASCII or binary file and executing an operating system command. Automated implementation will allow access by authorized users to any authorized system via an existing network connection. Typical security measures such as firewalls, log-ins, passwords, etc. can be used to protect the confidentiality of the database and mask ordering system.

Figure 7:
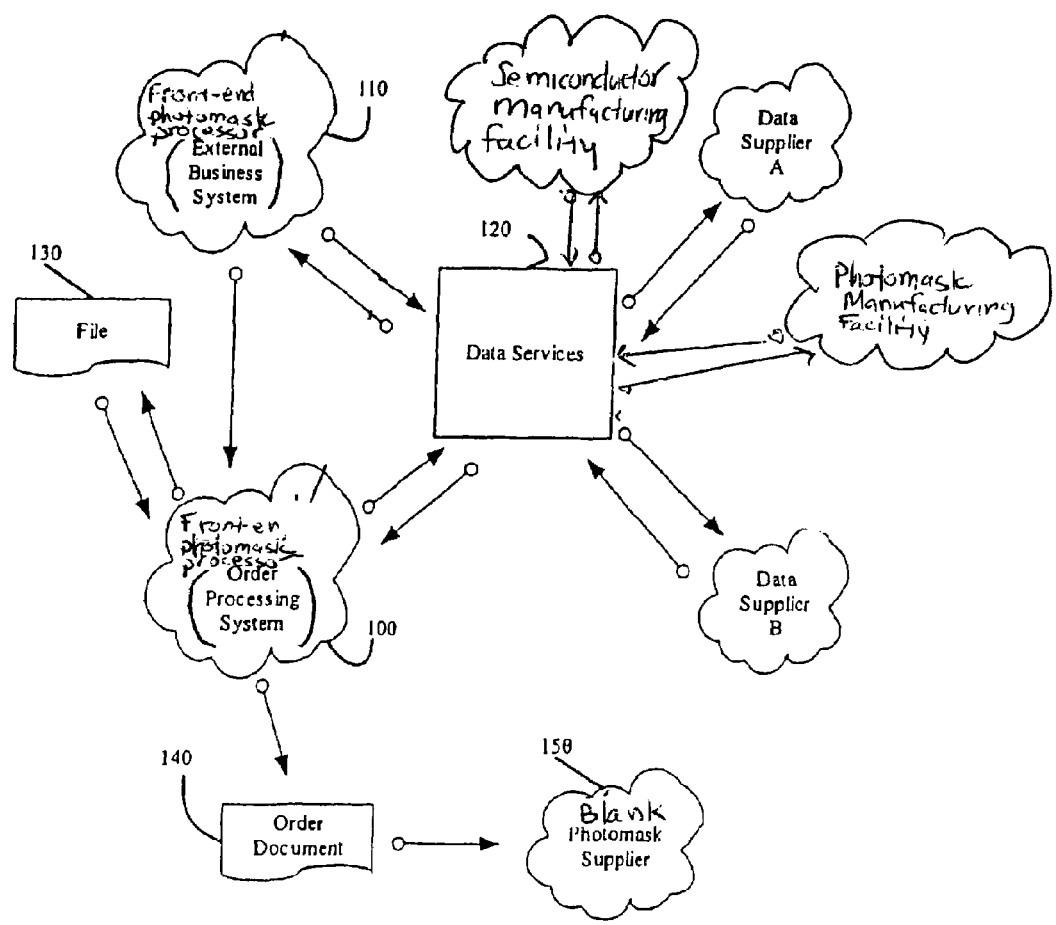
FIG. 7 shows a photomask order generating system according to an exemplary embodiment of the invention.

FIG. 7 illustrates an example of various potential embodiments of the automated features of the present invention. As shown in FIG. 7, the front-end photomask processor 110 has installed on its computer system or network an order processing system 100 consistent with the present invention. A user of this system may input a partial or complete order or template in the manner described above. A file 130 located on the front-end photomask processor's network is used to create or modify the template or order. To the extent that any information necessary to complete the order is not inputted directly by the front-end photomask processor, such information may be automatically retrieved by the order processing system 100 automatically from files, databases, or other electronic information available on the front-end photomask processor system; from a system external to the front-end photomask processor which can be accessed remotely; from one or more suppliers or vendors of the front-end photomask processor either directly; and/or through a data-service system. The front-end photomask processor may either input directly all the information necessary to complete an order, some of the information necessary to complete an order with the remainder coming from these other sources, or through an external program initiate a process which will automatically generate a complete order without having to access the graphical user interface of the order processing system. In the embodiment shown in FIG. 7, the information necessary to complete an order is retrieved from a data-services system 120. The data-services system 120 queries configured resources, such as data suppliers A and B, which can be, for example, suppliers or vendors of the front-end photomask processor. The data-services system 120 may also gather information from the front-end photomask processor itself. As shown in FIG. 6, information relating to the manufacturing equipment to be used to make a photomask can be obtained from the manufacturer via data-services system 120. Once all the necessary information is retrieved and entered into the proper template, an order document 140 is generated which is sent to the photomask supplier 150.

The execution of any task in an automated manner, may include alert notification of any system failure or process invalidation based on either sets of rules. Notification is configurable by the end user, and may be in the form of email, messaging, log files or database entries. In one embodiment, the notification feature automatically generates a message sent to a distribution list of the names of people who will be involved in the ordering of the photomask. This distribution list can be established by any predetermined criteria. Once the message is generated, each person on the distribution list may be automatically notified that an order for a photomask has been generated. Such notifications may include e-mail, beepers, instant messaging, mobile telephones, to name a few. This automatic notification process can be set up anywhere in the front-end photomask processor's network or even the manufacturer's network and be triggered by any step that the front-end photomask processor desires. This example should not be treated as limiting to the present invention and is merely illustrative of the type of notification system that can be incorporated with the present invention.

Upon notification of the preparation of a new or modified photomask order, the present invention can automatically forward the order to the photomask manufacturer, if no errors are present, or may wait for authorization from a user of the front-end photomask processor system. If errors are identified, the front-end photomask processor may then manually edit the order to fix such errors, and continue to process the order in a normal manner. Alternatively, the data can be automatically conditions to correct the errors.

In another embodiment, an incomplete photomask order may be generated, including design information in a format which can be transferred to the photomask manufacturer's processing system to allow the photomask manufacturer to verify the validity, feasibility and/or desirability of the design. For example, a front-end photomask processor may transfer a partial photomask order including fracture instructions which could then be transmitted to the photomask manufacturer to be analyzed for validity, feasibility and/or desirability of the proposed design. This could be done either automatically as described above, or manually. If automated, upon receipt of information regarding a proposed partial photomask order, the system could generate the information necessary to submit fracture instructions to a photomask supplier for further analysis and evaluation. Upon submission of the information, the photomask manufacturer may then also propose alternative designs which may be more feasible or desirable from the manufactures' perspective or otherwise. The results of the photomask manufacturer's analysis may then be transmitted to the front-end photomask processor computer system for further consideration by the front-end photomask processor on whether to go forward with the order or modify the proposed order.

Preferably, each of the templates, orders, components, and subcomponents, etc. is stored in a database, but may also be stored in other locations. A search engine may be provided on which users can search for a particular template, order, component, or subcomponent, etc. stored in the database or other locations. Using the search engine, the user can locate the appropriate templates, components, or subcomponents, etc. that are needed to generate a photomask in a particular order format. Once such templates, components, subcomponents, etc. are located, data relating to a photomask order is entered by a user (typically, a front-end photomask processor desiring to place an order for a photomask). The user can also use the search engine to locate existing photomask orders for the purpose of completing or facilitating the data entry or modifying their content, as described below.

As noted above, a front-end photomask processor may not have sufficient knowledge of the requirements of a particular photomask order format, and thus, may not enter all necessary information required by such standards to complete an order. Additionally, front-end photomask processors are prone to making data entry errors, and thus, may provide inaccurate information. Accordingly, a first and second set of rules are established and stored on the system to ensure that the front-end photomask processor enter complete and accurate data into the templates and orders, as required by a particular standard and/or proprietary photomask order format.

In the preferred embodiment, the first set of rules are established to ensure that a user input all necessary data to output a complete photomask order, as specified by a particular standard and/or proprietary photomask order format. Preferably, the first set of rules are established based on the requirements of a selected photomask order format. In this regard, the first set of rules dictates whether data "must" be input, "can" be input and/or "must not" be input into each component and subcomponent of a template or order, as dictated by the specified photomask order format. Additionally, the first set of rules should be configured such that they will require the user to enter information into any other components which are required (as set forth in a particular standard and/or proprietary photomask order format) to complete a photomask order.

Thus, for example, referring to Table 1, a particular standard order format may require, with respect to the "Pattern" template, that for all EAPSM orders: placement data and critical dimensions data must be provided; die to die inspection data may be provided; and die to data cannot be provided. Accordingly, rules are established and associated with the appropriate templates (and components and sub-components) which require that (1) the user "must" include placement data and critical dimension data; (2) the user "can" include die to die inspection data; and (3) the user "must not" include die to data inspection data. Accordingly, in this example, when a user seeks to create an order for an EAPSM using the system and method of the present invention, the rules will (1) require the user to input placement and critical dimension data; (2) permit (but not require) a user to enter die to die inspection data; and (3) preclude a user from entering die to data inspection. Additionally, the selected order format may require that, in addition to the Pattern Data, Array Registration data must also be entered to complete a photomask order. Accordingly, the first set of rules would also be configured such that once the user has completed entering all the pattern data, the user will be guided to the "Array Registration" template and be prompted to enter all required data into that template (and any other corresponding subcomponents of that template) as well. Similarly, if the standard and/or proprietary photomask order format requires the entry of data into any other templates to complete a photomask order, the first set of rules will guide the user to such other templates after the user has entered all data into the Array Registration template, and prompt the user to enter all required data into such template(s). Once the user has entered data in all required templates, the user will be permitted to finalize the template (subject to entering data according to the second set of rules as discussed below).

Thus, as should be apparent, the first set of rules of the present invention ensure that the user enters the necessary information into the appropriate templates as required by a particular standard and/or proprietary format to generate a photomask order. Put another way, the rules guide a user through the process of entering photomask order data to ensure that all necessary order information is entered into the templates.

Additionally, the system and method also provide for a second set of rules which ensure that a user input data in an accurate and proper format, as specified by a particular standard and/or proprietary photomask order format. As noted above, each component and subcomponent of a template is defined by a set of attributes (e.g., binary, string, integer, real number, date, Boolean, list, etc.). Thus, in a preferred embodiment, a second set of rules are established for each template and order that indicates to the user whether the data entered into a particular template or order "must," "can" and/or "must not" have a particular attribute, as required by a particular standard and/or proprietary photomask order format.

For example, referring to Table 1, a particular standard and/or proprietary photomask order format may require that (1) the data entered into the placement template "must" be an integer; (2) the data entered into the title template "can" be a string; and (3) the data entered into the critical dimension template "must not" be a string. Accordingly, a rule is established for the placement template which (1) requires the user to enter an integer in the placement template; (2) allows the user to enter a string into the title template; and (3) prevents the user from entering a string into the critical dimension template. Thus, as should be apparent, the rules of the present invention ensure that the user enter the appropriate type of information and data type into each template as required by a particular standard and/or proprietary photomask order format to generate a photomask order. In other words, the second set of rules only permit the user to enter a certain type of data into a template, and thus, reduce the possibility of having design errors and/or data entry errors in the process of placing a photomask order.

In a preferred embodiment, the first and second set of rules described herein are created and stored separately. As noted above, the rules may be stored either internally in the system or externally from the system in any different number of dynamic formats (e.g., as a database, an object-oriented class, an XML file, etc.) so that the system may be adapted to run on any number of platforms, depending the preferences or a user and/or automated system. It should be noted, however, that a single set of rules can be created and stored, provided that such single set of rules ensures that a user both complete photomask order information (as described with reference to the first set of rules) and accurate photomask order information (as described with reference to the second set of rules). Further, the first and second set of rules may be combined as a single set of rules in a similar manner.

As noted above, the present invention includes a function to associate specific first and second sets of rules with specific templates, to ensure that a photomask order is generated in a complete and accurate manner. In the preferred embodiment, this functionality is provided in the form of a software-based application installed on the computer of an entity desiring to place an order for a photomask, such as a semiconductor manufacturer. Unlike the prior art, this software is not dependent on a given photomask manufacturer's manufacturing process. Rather, the software of the present invention can be deployed as a stand-alone secure application, a network distributed application, or a web-based "thin-client" application. Preferably, the software is utilized in a client-server system, wherein a graphical user interface (e.g., the client) connects to and retrieves data from a database on the server. In all cases, the front-end photomask processor running the software of the present invention is not required to access and/or login to any external local area network of a photomask manufacturer to place an order.

The manner in which the software of the present invention associates specific rules with specific templates is now described. In particular, since the templates are hierarchical collections of data, each element of a template is interpreted by an associated software object. In the preferred embodiment, rules are embedded within the software objects and are responsible for the assembly of the data entered in the templates. These rules are constraints or instructions, such as an algorithm, and typically relate to one or more attributes of the software object. Accordingly, with this arrangement, it is possible to enter a complete and accurate photomask order as the rules and templates are appropriately associated with each other.

Additionally, the system is preferably configured to permit the rules and templates to be separately updated should the need arise. In this regard, the current standard photomask order format is known as the SEMI P-10 standard format. However, it is anticipated that as technological advances are made, a new standard format may be developed to cover these advances, and thus, replace the current SEMI P-10 standard format. Additionally, there are currently many other international standard order formats that are used by photomask manufacturers overseas. As with the SEMI P-10 format, it is expected that these international formats will also change or be replaced over time. Thus, the system of the present invention provides for the ability to update the rules and templates to meet these changes. More particularly, the first and second sets of rules are preferably stored as separate files from each of the templates, which are in turn also each stored as separate files. By keeping the rules and templates separate, any modification to one will have no effect on the other. In this regard, when the rules or templates are modified, there will be no need for a correlative code change to a corresponding element where none would be indicated by the proximate feature modification. Additionally, by storing the rules and templates separately, the possibility of the occurrence of a system seize-up (e.g., where unanticipated changes to an embedded or inner-nested element might cause an unanticipated failure) can be avoided. In this regard, if rules and templates were not stored separately, independent modification would be impossible. Each of the existing templates, of which there could be thousands if not more, would then have to be modified individually to include the new rules. Thus, as should be readily apparent, the system and method of the present invention is not limited to any one particular standard format, but rather can be easily adapted to conform to the requirements of any current or newly developed standard photomask order format. Similarly, a front-end photomask processor may change its proprietary order format to meet any changes associated with new developments or improved technologies.

To modify the rules, software objects are established such that the rules contained therein may affect one or more of their attributes, their children or other rules contained within it. In this regard, the rules are established such that only certain specified attributes are affected by rules. Thus, since the software objects, like templates, are hierarchical in nature, they know both their parent and children. Accordingly, any time a child object is modified, it notifies its parent of the area, rules, or attributes impacted by the change. As a result, any change made anywhere within the hierarchy of rules is propagated through the entire family. Accordingly, the rules have the capability to enforce the addition of, or the removal of, any child element of the parent. Thus, within the application, each object is individually updateable or upgradeable through subsequent releases of the software. Additionally, object parents maintain a standard collection for each type of child element, which can be added or removed while the template is being constructed.

Templates can also be modified in response to a modification of a standard and/or proprietary photomask order format which requires the addition of new attributes and/or subcomponents to the hierarchy of orders and templates. In such instances, the new relationships are defined for affected components and/or subcomponents and new rules are dynamically added to the existing rule schema.

To illustrate these features of the present invention, the following example is now described. The current SEMI P-10 standard requires that a photomask order include, among other things: Mask Order[ ], Mask Set [ ], Mask Definition [ ], and Pattern Definition[ ]. Thus, according to this requirement, the following templates would be established: SemiOrder Template, SemiMaskSet Template, SemiMask Template and SemiPattern Template. Additionally, a first and second set of rules for each of these templates would be established which dictate whether data must be entered into each of the templates and the type of data that can be entered into such templates. However, at a later point in time, the SEMI P-10 standard may be replaced by a new standard that requires a CD component. Thus, the existing templates (e.g., SemiPattern) could be modified to include, for example, a critical dimension (CD) component to conform to a modification of the metrology aspect of the SEMI P10 standard. Additionally, a new template could be created to conform to any newly added aspects (e.g., registration) of the new SEMI standard. Similarly, the already existing first and second set of rules could be adapted to meet the changes associated with the modified CD component aspect of the current SEMI P10 standard. Additionally, a new set of first and second set of rules could be created to conform to the new registration feature of the new SEMI standard.

Specification grades may also be used as a mechanism to easily update a specific data entry included in a large number of templates, orders, components, subcomponents, etc. In particular, in one embodiment of the present invention, a specification grades file may include the specific data or objects deemed desirable for future updates in many orders, templates, components, subcomponents, etc. The various orders, templates, components, subcomponents, etc. would then include a reference to the specification grades file for the specific data therein instead of storing the specific data. In this manner, these referenced specific data or objects can be updated in a large number of orders, templates, components, subcomponents, etc. by merely updating the specification grades file, rather than updating all the orders, templates, components, subcomponents, etc. referencing these specific data or objects.

For example, a specification grade may include a standard critical dimension (CD) line width that is considered acceptable to a particular photomask front-end photomask processor at a given time. As the photomask technology continues to develop, the acceptable CD line width will likely undergo changes. Rather than having to individually update each order, templates, component, subcomponents, etc. that specifies a particular CD, the use of the specification grades allows one to update only one specification grades file, and then all the files that refer to that specification grades file will automatically be upgraded. Other examples of appropriate variables to provide as specification grades in the context of a photomask order include: measurement tolerances associated with mask attributes that need to be met by the photomask manufacturer to ensure the mask meets the front-end photomask processor specifications; acceptable defect rates associated with mask attributes that need to be met by the photomask manufacturer to ensure the mask meets the front-end photomask processor specifications; materials (substrate, pellicles) associated with the manufacture of photomasks that must meet quality levels paid for and expected by the front-end photomask processor; accounting information including pricing and billing/shipping information; front-end photomask processor service information such as contact name and phone number, class of machines or specific machines required to meet internal or front-end photomask processor requirements needed in the production of photomasks; Lithography pattern placement information including, but not limited to, data tone, beam exposure, X/Y placement information; data transmission information including, but not limited to, email addresses, FTP addresses, protocol, login ID and password, directory structure; and vendor specific information associated to raw materials used in the manufacture of photomasks including, but not limited to, substrates, pellicles, compacts, resist and unique equipment used in the manufacture such as "Applied Materials Alta 3500" or "KLA Starlight", to name a few.

As discussed above, a template or order is comprised of one or more associated objects, such as components, subcomponents, data, etc. For example, a photomask may have one or more associated attribute objects such as registration, titles, barcodes, etc. In an embodiment of the present invention using the specification grades, a utility may be provided to allow an end-user to create one or more unique data or objects that may be associated to a template or order. These objects will be stored separately from the associated orders and templates. Furthermore, these separately stored objects may have their own set of rules. When a template or an order is created, the end-user may be allowed to associate the template or order with some or all of the objects defined in the utility. Upon generation of a template, order, or an order created from a stored template, all object information stored in the utility that has been associated to the template, order, or template used to create an order may be regarded as reference data and applied to the template, order, or template used to create an order. Reference object information may be updated or removed based on the "roles and responsibility" assigned to the end-user in the application's security module. For example, a less-experienced end-user may be prohibited from overwriting the reference data stored in the utility. On the other hand, an experienced user may be granted a permission to modify the reference data.

Another aspect of the present invention is that it provides for the ability to generate new photomask orders by: (1) merging data into a new order from an already existing template having data contained therein; (2) merging data into a new order from an already existing order having data contained therein; (3) merging data into a new order from already existing templates and orders; or (4) merging data into a new order from already existing orders, templates, components and/or subcomponents. In this regard, whenever a user enters data into either a template or creates an order, such template and/or order is saved on the system of the present invention. Further, as previously discussed, components and subcomponents may be stored separately from an order or template on the system of the present invention. Thereafter, a user is able to access the already existing templates, orders, components, and/or subcomponents, and use the data saved therein to generate a new order. By providing a user of the system of the present invention with the ability to merge data from already existing orders, templates, components, and/or subcomponents, the process for entering photomask order data is greatly reduced, thereby reducing the overall time it takes to manufacture a photomask order. Each of the four methods for merging data into an order is described below.

In one embodiment, to create a new order from an existing template(s), the user is prompted to create a new, blank order. Next, the user is provided with the option of selecting templates and/or orders which were created and saved from a previous photomask order. Depending upon the type of photomask to be manufactured from the new order, the user selects and loads the most relevant template(s) stored in the relational database. The selected template is displayed to the user with previously entered data. For each non-null object within the template (e.g., the object contains data), the user may either select the previously entered data into the new order or over-write this data with new data. Additionally, to the extent that a particular object within a template is null (e.g., it is already empty), the user may enter appropriate data within that object. Next, the rules established for this order operate as described above to ensure that data is accurately and completely entered. Thereafter, the software processes this information and generates a new order based on this information.

The process for creating a new order from an already existing order is similar to the process of creating a new order from an already existing template. In this embodiment, to create a new order from an existing order(s), the user is prompted to create a new, blank order. Next, the user is provided with the option of selecting templates and/or orders which were created and saved from a previous photomask order. Depending upon the type of photomask to be manufactured from the new order, the user selects and loads the relevant order(s) stored in a relational database. The selected order is displayed to the user with previously entered data. For each non-null object within the order, the user may either select the previously entered data into the new order or over-write this data with new data. Additionally, to the extent that a particular object within an order is null, the user may enter appropriate data within that object. Next, the rules established for this order operate as described above to ensure that data is accurately and completely entered. Thereafter, the software processes this information and generates a new order based on this information.

In yet another embodiment, to create a new order from both an existing template(s) and order(s), the user is prompted to create a new, blank order. Next, the user is provided with the option of selecting templates and/or orders which were created and saved from a previous photomask order. Depending upon the type of photomask to be manufactured from the new order, the user selects and loads the relevant template(s) stored in a relational database. The selected template is displayed to the user with previously entered data. For each non-null object within the template, the user may either select the previously entered data into the new order or over-write this data with new data. Additionally, to the extent that a particular object within a template is null, the user may enter appropriate data within that object. Next, the rules established for this order operate as described above to ensure that data is accurately and completely entered. Additionally, previously saved orders may also be merged into the same order. In this regard, the user can select and load previously placed order(s) stored in a relational database. The selected order is displayed to the user with previously entered data. For each non-null object within the order (e.g., the object contains data), the user may either select the previously entered data into the new order or over-write this data with new data. Additionally, to the extent that a particular object within a order is already empty, the user may enter appropriate data within that object. Next, the rules established for this order operate as described above to ensure that data is accurately and completely entered. Once all of the appropriate templates and orders have been merged into the new order, the software processes this information and generates a new order based on this information.

Also, existing components and/or subcomponents of a previous order or template may be imported into a new photomask order or template. For example, existing components and/or subcomponents related to billing and/or shipping address may be applied to an order or a template. In addition, one or more unique specification grades defined within the application may be merged into a new order or template.

Once the front-end photomask processor has entered order data using the software of the first aspect of the present invention and has generated photomask pattern data, the second software application of the present invention automatically processes at least a portion of this information into a ready-to-write format and a ready-to-inspect format. In one embodiment, the software for performing this function is loaded on the front-end photomask processor's computer system. Thereafter, the processed information is sent in a data file to an external, remote manufacturer's computer system for manufacturing.

More particularly, in one embodiment, the front-end photomask processor's computer system includes a server on which both the first and second software components are installed. The order data generated by the front-end photomask processor and pattern data generated by the front-end photomask processor are transferred to the server. In a preferred embodiment, Parsing Software is included within the front-end photomask processor's server to implement postjobprocess and does two basic things. First, the Parsing Software examines the files that have just been transferred to the Server and copies them, as appropriate (and if configured to do so), to predefined working data directories. Second, the Parsing Software logs everything it does to an audit trail mail message which it then sends out to any number of preconfigured mail addresses. These mail addresses can be programmed to vary depending upon the front-end photomask processor, or facility in which the processing is to take place. This mail message is both a front-end photomask processor acknowledgment and a internal notification that a data transfer has taken place.

In a preferred embodiment, the pattern data is routed by the Parsing Software to a Memory Pool connected to the FTP Server and stored therein for later processing. Alternatively, the pattern data could be transferred through other conduits, or may be stored in the FTP Server.

Similarly, in a preferred embodiment the order is routed by the Parsing Software to another computer server in the front-end photomask processor's for processing ("the Processing Server"), which is connected either directly or remotely by a network connection to the FTP Server. Alternatively, the FTP Server and the Processing Server could be the same computer. The Processing Server includes software ("the SEMI Software") for processing the order which automatically extracts or parses data from the order to be processed and/or formatted for use with manufacturing equipment. Such processing and/or formatting may occur either on the same computer server as the Processing Server or on other computer servers on the front-end photomask processor's network.

Figure 12:
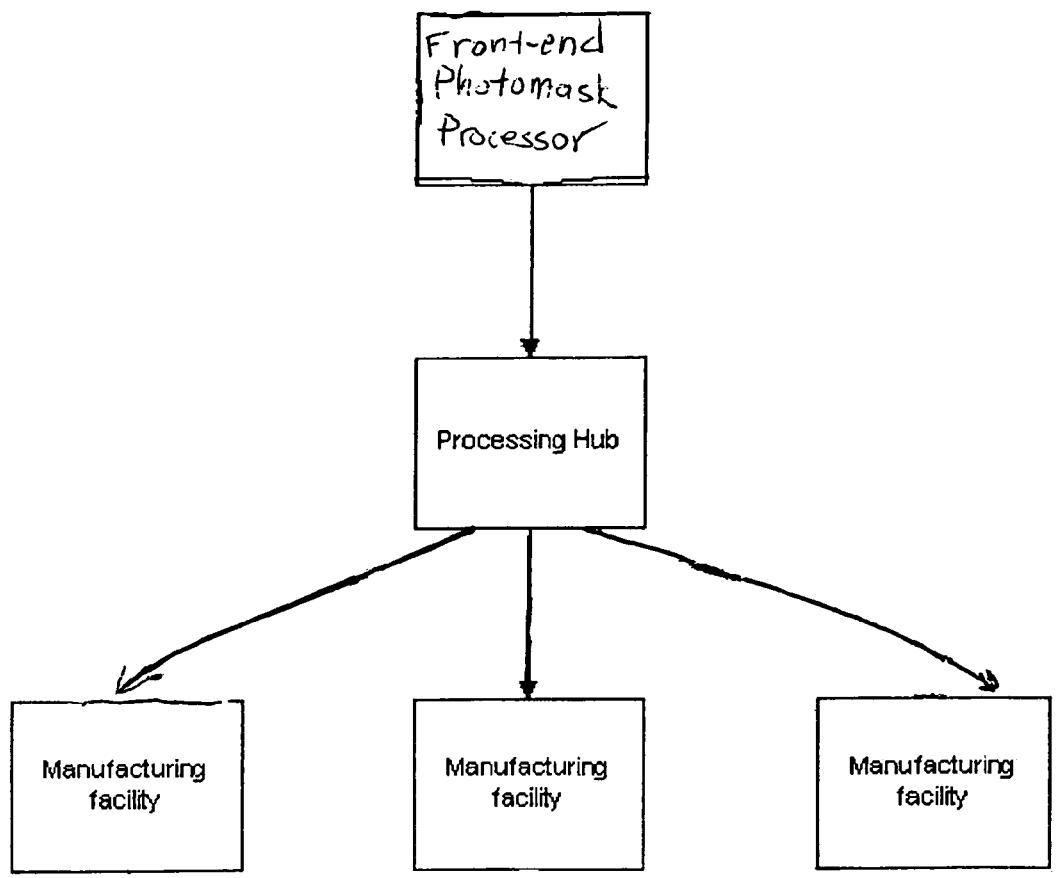
FIG. 12 is a block diagram showing an alternative multi-facility configuration of the present invention shown in FIG. 9.

In another embodiment, as shown in FIG. 12, remote front-end photomask processor facilities can also be equipped with additional Processing Servers having the same or similar SEMI Software installed thereon. Thus, it is possible to enable a multitude of remote front-end photomask processor facilities in other locales to interface, via a network connection, to the FTP Server. As a result, order and pattern data received by the FTP Server can be routed for processing to a variety of remote front-end photomask processor facilities in accordance with the present invention.

In a preferred embodiment, at the start of processing this data, the SEMI Software automatically notifies those persons who will be involved in the manufacture of the photomask that an order for a photomask has been entered. This notification feature can be automatically triggered when the SEMI Specification is received. More particularly, when enabled, the notification feature may automatically generate a message sent to a distribution list of the names of people who will be involved in the manufacture of the photomask corresponding to the SEMI Specification. This distribution list can be established by any predetermined criteria. In one embodiment, the distribution list is established by the location of the Processing Server on which the SEMI Software is installed. Thus, for example, where the SEMI Software is installed on a Processing Server located in a facility located in Singapore, the distribution list will include the names of only those persons located in that facility. By contrary example, if the SEMI Software is installed on a Processing Server located in a facility located in Germany, the distribution list will include the names of only those persons located in that facility. Once the message is generated, each person on the distribution list may be automatically notified that an order for a photomask has been received. Such notifications may include e-mail, beepers, mobile telephones, etc. This automatic notification process can be set up anywhere in the front-end photomask processor's network and be triggered by any processing step that the front-end photomask processor desires. This example should not be treated as limiting to the present invention and is merely illustrative of the type of notification system that can be incorporated with the present invention.

Figure 10:
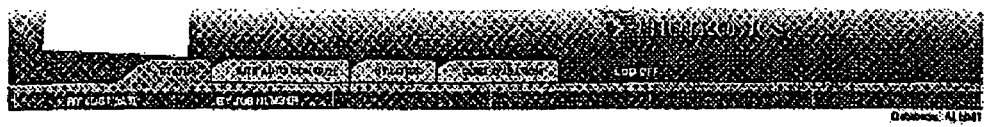
FIG. 10 is a screen shot of the data array implemented in the Processing Server of the present invention.

Next, the SEMI Specification is processed. In this regard, the SEMI Software may include features which automatically extract data from the SEMI Specification, arranges the extracted data according to manufacturing tasks to be performed, and generates a data array in which the arranged data is stored. In the preferred embodiment and as shown in FIG. 10, the data array includes information identifying the front-end photomask processor ("Enterprise"), front-end photomask processor wafer fab ("FAB"), the technology implemented ("Technology"), the job number, the front-end photomask processor design information for the photomask ("Device"), a status report as to the manufacture of the photomask ("Status"), and the date the order ("Order Rcvd") and/or the order was received ("P-10 Received").

It should be noted, however, that the preferred data array could be easily modified to add additional descriptive categories when needed or show less categories if desired. Further, the data array could also include more detailed sub-data arrays which are linked to any of the above listed photomask information categories.

For example, a sub-data array could be hyperlinked to a particular JOB No. This sub-data array could include time and date stamped information documenting each step performed in the manufacture of the photomask.

Additionally, a sub-data array could be hyperlinked to the Device category. In a preferred embodiment, this sub-data array includes data which has been extracted from the order and arranged for use in connection with a variety of manufacturing tasks which may need to be performed in manufacturing the photomask. These manufacturing tasks, for example, included but are not necessarily limited to, jobdeck processing ("Jobdeck"), electronic critical dimension plotting ("E-CD Plots"), SEMI specification conditioning ("SEMI"), bar coding ("Bar Code"), registration measure file creation ("REG MF2"), data sizing ("Data S/R"), double checking ("Double Chk"). Although not shown, this sub-data array may also include other manufacturing tasks such as, for example, fracturing, on-grid checking, optical proximity correction and flagging.

Figure 9:
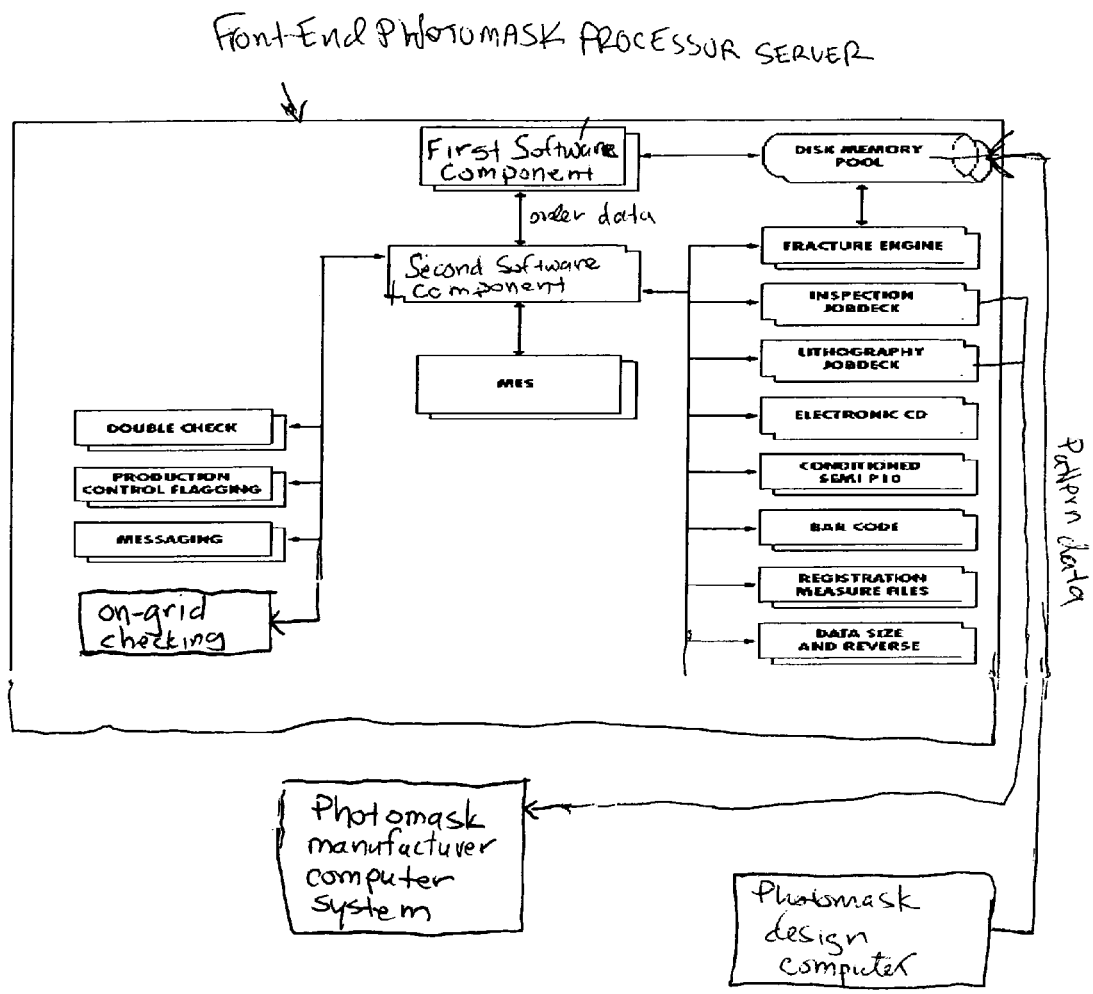
FIG. 9 is a block diagram showing a configuration of the automated manufacturing system of the present invention.

Referring to FIG. 9, the SEMI Processing Software arranges and processes the extracted data according to these manufacturing tasks to be performed. Additionally, this sub-data array may include other information, including, but not limited to, a code name for the pattern to be formed on the photomask ("Layer"), the manufacturer's inventory control number ("Plate No"), the order in which each photomask should be processed according to the front-end photomask processor's preference ("Pri"), a status report on the manufacturing process for the photomask ("Layer Status") and the date on which the data was received by the SEMI Processing Software ("Data Rcd").

The manner in which data is organized in this sub-data array is now described. Jobdeck processing refers to the method by which instructions are transferred to and processed by lithography tools (e.g., E-beam and laser beam) and inspection equipment (e.g., KLA or Orbot). In the case of lithography jobdeck processing, certain instructions which are needed to write a pattern on a photomask blank are extracted from the order and stored in Jobdeck of the sub-data array shown in FIG. 10. These extracted jobdeck instructions are then processed by the SEMI Software for use with the lithography tools. These instructions indicate the location on the photomask in which the various patterns are to be placed, as well as other functions to be performed by the particular tool including but not necessarily limited to controlling exposure, scaling of patterns, and tone. Alternatively, the extracted job instructions may be modified to account for other information regarding the particular front-end photomask processor, its division or internal manufacturing site, etc., to generate the appropriate instructions for the lithography tools or other processing equipment. For example, jobdeck instructions may need to be routinely modified for a particular manufacturing center of a front-end photomask processor to account for the fact that the instructions provided by such front-end photomask processor require the pattern to be reversed by the lithography tools, which may be a time consuming process as compared to reversing the pattern when fracturing the pattern data.

With respect to inspection jobdeck processing, the relevant specifications are extracted from the order and arranged for use by inspection equipment. These instructions are also stored in the jobdeck. The extracted specifications for the inspection equipment should be arranged and formatted such that the inspection equipment can inspect a processed photomask for defects (e.g., die-to-data comparison) and contaminations (i.e., cleanliness).

Figure 11:
FIG. 11 is a screen shot of a sub-data array hyperlinked to the data array of FIG. 10 implemented in a Processing Server of the present invention.

SEMI Conditioning refers to a process by which the order provided by the front-end photomask processor is automatically modified to include additional details, be reformatted or otherwise arranged and/or remove extraneous details. In this regard, the SEMI Processing Software includes functions by which it can add various information to the order. For example, a front-end photomask processor's business requirements, such as a preferred delivery address, can be automatically added to the order and stored in SEMI as shown in FIG. 11. Likewise, manufacturing information can also be added to the order and stored in sub-data array. In this regard, the SEMI Software is programmed to adjust certain data (e.g., critical dimensions, biasing information, pellicle type) based on various circumstances (e.g., modifications based on peculiarities of the manufacturer's equipment or specific front-end photomask processor requirements) which may arise in the manufacturing process that have not been taken into account by the front-end photomask processor, or in the front-end photomask processor's order.

Additionally, the SEMI Software automatically generates instructions for the fracture engine to fracture the pattern data. Fracturing is a well known process whereby the pattern data is divided (i.e., fractured) into shapes and segments which the lithography tool can understand. In a preferred embodiment, the fracturing instructions are generated in the form of a "cinc" file. In one embodiment, computer aided transcription software ("CATS") is used to fracture the pattern data and view the same. CATS is a commercially available software which simulates jobdeck schemes (e.g., a mask layout) for the purposes of viewing data prior to the manufacturing process. It should be noted, however, that the fracturing instructions may generated using other software in other formats as well. The fracturing instructions may be stored on the Processing Server or on a stand-alone separate Disk Memory Pool. A Fracture Engine Server interfaces with the Processing Server or Disk Memory Pool to read the fracturing instructions and fracture the pattern data.

Once the pattern data has been fractured, the integrity of the fractured data should be verified. The verification process involves any of the known or hereinafter developed techniques used in the photomask processing.

Further, bar coding refers to the process by which bar codes are applied to a photomask. More specifically, certain front-end photomask processors may desire to include a bar code on its photomasks for inventory tracking purposes. Thus, where the front-end photomask processor has included information in the order for such bar codes, the SEMI Processing Software extracts this data, formats it, and creates pattern data in a form usable by the Lithography Tools. The Lithography Tools are directed to the bar code pattern data by the Litho Jobdeck Instructions to use it to write the bar code on the photomask.

The process of creating registration measure files refers to a method by which a file is created that contains coordinates which the inspection tools will use to align the photomasks. These coordinates can be used together to expose an image on a semi-conductor. The registration information may also be used in the semiconductor manufacturing process to align the photomask with the semiconductor wafer, or other photomask layers. The SEMI Software extracts from the order the appropriate data for creation of the registration measure file and formats such data for equipment which performs the registration inspection process. In this regard, the registration files can be in a variety of formats, including, but not limited to, .MF2 files, .MF3 files, critical dimension files, etc. The process of data sizing and reversing refers to a method by which the size and tone of patterned data is modified to facilitate processing of the photomask in the manufacturing process. The SEMI Software extracts the appropriate instruction from the order and creates the fracture instructions for the data sizing operation. These instructions are typically stored in a cinc file. The status of the performance of this process is tracked in Data S/R in FIG. 9.

In the case of a binary photomask designs, the SEMI Software automatically applies a data bias to the pattern data to provide for a degree of latitude to account for movement which of the substrate during manufacture of the photomask. Thus, any movement of the substantially transparent and substantially opaque features of the photomask will be accounted for such that the photomask is still manufactured in accordance with the design specifications. Factors to consider applying a data bias include, but are not limited to, production control flagging, the facility at which the photomask will be manufactured (e.g., a photomask manufacturing facility, a front-end photomask processor's facility) and conditions at those facilities which may have an impact on the manufacture of the photomask (e.g., sizing, shifting, special comments, pattern naming updates, building jobdeck and uploading of pattern names into semi file or MES file).

In the case of phase shift photomask ("PSM") designs, the SEMI Software automatically applies an optical proximity correction ("OPC") to the pattern data to correct critical dimension and resolution various that typically appear on PSMs (e.g., aaPSMs, EAPSMs) and similar sub-resolution structures. In this regard, the software of the present invention applies an OPC which modifies mask layout geometries of the mask design to account for systematic distortions introduced during fabrication.

Additionally, the process of production control flagging refers to a feature which determines the appropriate manufacturing facility in which a particular front-end photomask processor order will be processed. For example, where a photomask manufacturer includes manufacturing facilities in Germany and Singapore, the SEMI Software analyzes the front-end photomask processor's order and determines whether the photomask will be manufactured in Germany or Singapore, or some combination thereof. The production control flagging features can be set to make this determination based on any variety of criteria, including, but not limited to, the lithography tools used at each manufacturing site, the front-end photomask processor's preference, and the work load at each facility.

The double checking feature refers to a process which compares for the accuracy in the pattern data which has been sized with the specifications provided by the front-end photomask processor. The SEMI Software extracts data from the order and arranges it to be read by equipment which performs this double checking feature.

On-grid check refers to the process of comparing the placement of pattern data in the jobdeck to the internal placement "grid" of the Lithography tool. A pattern is considered off grid if the finite placement coordinate point falls between the points of the Litho tools internal grid.

Another feature of the present invention is an automated messaging feature which is programmed to recognize and report errors and other occurrences (i.e., that a process has started or ended) to members of the distribution list discussed herein. This feature can be used as described above with respect to the FTP Server and the Processing Server.

Additionally, electronic critical dimensions plots ("E-CD Plots") refers to the process by which an electronic picture of the pattern data on the photomask which has been processed is marked with internal reference marks for quality control purposes. As relevant here, the SEMI Processing Software extracts the necessary instructions for E-CD Plotting from the order and typically creates a cinq file for the fracture engine to use in creating plot files and stores them to the Disk Memory Pool.

Depending upon the format in which the order is provided, some or all of manufacturing tasks may or may not need to be performed. Thus, any of the manufacturing tasks listed in the data array may be optionally disabled. The manner in which the data will be arranged for each of these processing functions will vary according to the specification provided by the front-end photomask processor. Nevertheless, the data should be arranged such that each of the functions could be performed.

This system also includes an automated and interactive monitoring system which provides for prompt identification and notification of the status of any manufacturing tasks as well as errors encountered in performing such tasks. Referring to FIGS. 9 and 10, in a preferred embodiment, this interactive monitoring system is provided in the form of a web site on an intranet which can be accessed via a secure authentication, including but not limited to a password. Alternatively this web site could also be accessed on the World Wide Web, and/or any other web, either by authentication or not. Once this web site is entered, a technician can view the status of each manufacturing task. If any errors have occurred, the technician can stop that particular manufacturing task, correct the error, and restart the process.

Additionally, a manufacturing execution system ("MES") can be installed on a client computer which may also be interfaced by the Processing Server. MES systems are well known in the art and provide a system user with the capability of tracking the manufacturing process, generating billing information, and down loading the results of the various manufacturing tasks discussed herein.

The present invention may also be used to interface and automatically pass conditioned data to any MES system which implements a standard or custom protocol, including but not limited to XML, SOAP, ebXml, Rosetta Net and other like protocol.

Other tasks can be included, although not shown in FIG. 9, such as process determination, which is the automated tool selection process. In particular, in process determination, the particular unit or type of processing equipment to be utilized in the manufacture of the photomask (e.g., the specific litho or inspection tool) is specified. This information may be specified either by the front-end photomask processor or as a result of the site chosen to perform the particular task.

Once of the relevant data files are generated by the relevant features of the second software component of the present invention, in a preferred embodiment, these data files are merged into a single file. If desired, these files can be maintained as separate files or merged as a multiple set of files. The data file should include at least a portion of the order data and pattern data that is in a substantially ready-to-write format and/or a ready-to-inspect format. In other words, the data file should be in a format which, when received by the manufacturer, can be input into the appropriate manufacturing equipment to substantially write and inspect a photomask in accordance with the front-end photomask processor's specifications. Of course, it may be necessary to have some knowledge as to the type of equipment being used by the manufacturer to ensure that the data file is in the proper format for that equipment. Thus, where appropriate and necessary, the front-end photomask processor should obtain manufacturing equipment (e.g., lithography tools, inspection equipment, etc.) requirements from the manufacturer and incorporate that information into the data file. In one embodiment, this can be accomplished by the front-end photomask processor sending an electronic signal (e.g., an e-mail) to the manufacturer advising that they are entering an order and require information pertaining to the manufacturing facility and related equipment to be used to make the photomask. The manufacturer, in turn, will transmit an electronic signal to the front-end photomask processor providing this information. These signals should be sent prior to completion of the entry of the photomask order. In one embodiment, these steps are performed using the data services network and method of the present invention.

Once the data file is compiled, the front-end photomask processor sends this file via a network connection to an external, remote manufacturer's system for manufacturing. In one embodiment, the front-end photomask processor electronically transfers this information to the manufacturer via a TCP/IP based network (e.g., the Internet) using file transfer protocol ("FTP"). The present invention could also use other protocols, such as parsing an attachment of an e-mail or by downloaded the file from other media. Once the manufacturer's system receives the file, the manufacturer will manufacture a photomask in accordance with the instructions and specifications provided therein. In some instances, it may be necessary for the manufacturer to do some additional conditioning of this file once received. Thereafter, the photomask can be used to make a semiconductor via the known techniques discussed herein.

Now that the preferred embodiments of the present invention have been shown and described in detail, various modifications and improvements thereon will become readily apparent to those skilled in the art. For example, in the preferred embodiment, the first and second software components used by a front-end photomask processor to enter a photomask order and process at least a portion of that order into a substantially ready-to-write file and/or substantially ready-to-inspect file, which is in turn sent to a remote manufacturing facility. However, it should be understood that the present invention could be modified such that the first software component is used by a front-end photomask processor of a front-end photomask processor, wherein the front-end photomask processor would send the photomask order to the photomask processor who would in turn process the order using the second software component of the present invention. Accordingly, the spirit and scope of the present invention is to be construed broadly and limited only by the appended claims and not by the foregoing specification.

What is claimed is:

1. A method of processing mask data by converting design data in a form of an electronic circuit design data file for use in manufacturing a photomask having substantially transparent and substantially opaque features into a data format suitable for a specific photomask manufacturing processing comprising the steps of:
   entering the design data using a specific form of the electronic circuit design data;
   inputting requirements for processing an order for a photomask made in accordance with the design data;
   obtaining information identifying which one of a plurality of photomask manufacturing equipment shall be used to manufacture the photomask;
   sizing the design data to facilitate process movement of the substantially transparent and substantially opaque features in the photomask;
   fracturing at least a portion of the design data into a substantially ready-to-write format compatible with the specific photomask manufacturing processing;
   verifying the integrity of the fractured design data;
   merging two or more sets of data generated from one or more of the following data types: (i) the entered design data; (ii) the sized design data; (iii) the fractured data; and (iv) the verification of the fractured data;
   conditioning said data set to be compatible with said mask manufacturing process and said photomask manufacture equipment; and
   sending the conditioned data set to a remote manufacturing system associated with the specific photomask manufacturing processing.

2. The method of claim 1, further comprising the step of fracturing at least a portion of the design data into a substantially ready-to-inspect format compatible with the specific photomask manufacturing processing.

3. The method of claim 1, wherein said photomask manufacturing processing comprises an inspection jobdeck.

4. The method of claim 1, wherein said photomask manufacturing processing comprises a lithography jobdeck.

5. The method of claim 1, wherein said sizing step further comprises the step of production control flagging.

6. The method of claim 5, wherein said step of production control flagging is based on one or more of the following criteria: type of lithography tools used at the manufacturing site; a front-end photomask processor's preference; and a work load at each facility.

7. The method of claim 1, wherein said sizing step further comprises the step determining a manufacturing facility.

8. The method of claim 1, wherein said sizing step further comprises the step determining biasing based on a manufacturing facility.

9. The method of claim 1, wherein said sizing step further comprises the step determining a photomask manufacturing facility.

10. The method of claim 1, wherein said sizing step further comprises the step of conditioning data based on photomask and customer facility.

11. The method of claim 10, wherein said step of conditioning comprises one or more of the following steps: (i) sizing the data; (ii) shifting the data; (iii) providing special comments relating to the data; (iv) updating a pattern's name; (v) building a jobdeck, uploading pattern names into a SEMI file; and (vi) uploading pattern names into an MES file.

12. The method of claim 1, further comprising the step of processing at least one jobdeck.

13. The method of claim 1, further comprising the steps selected from the group consisting: of plotting electronic critical dimensions; conditioning SEMI specifications; generating a bar code identifying the photomask to be manufactured; creating a registration measure file; double checking said data; and flagging said data with an identification of a manufacturing facility where said photomask is to be manufactured.

14. The method of claim 1, wherein said requirements are in a photomask industry format.

15. The method of claim 1, wherein said requirements are in a proprietary format.

16. The method of claim 15, wherein said proprietary format is based on a front-end photomask processor's design system.

17. The method of claim 15, wherein said proprietary format is based on a photomask manufacturer's processing system.

18. The method of claim 1, wherein said step of inputting requirements is governed by a first software component which comprises at least one subcomponent selected from the group consisting of: (1) templates in which data is entered; (2) rules for converting the data entered in the templates into a specified format; (3) instructions for using templates to create a photomask order in a specified format; (4) a separate set of rules for validating photomask order against the specified format; and (5) at least one unique attribute object associated with a photomask template or order.

19. An automated system for processing mask data by converting design data in a form of an electronic circuit design data file for use in manufacturing a photomask having substantially transparent and substantially opaque features into a data format suitable for a specific photomask manufacturing processing, comprising a computer readable medium containing instructions, the instructions being executable on a processor capable of performing the following steps:
  entering the design data using a specific form of the electronic circuit design data;
  inputting requirements for processing an order for a photomask made in accordance with the design data;
  obtaining information identifying which one of a plurality of photomask manufacturing equipment shall be used to manufacture the photomask;
  sizing the design data to facilitate process movement of the substantially transparent and substantially opaque features in the photomask;
  fracturing at least a portion of the design data into a substantially ready-to-write format compatible with the specific photomask manufacturing processing;
  verifying the integrity of the fractured design data;
  merging two or more sets of data from one or more of the following data types: (i) the entered design data; (ii) the sized design data; (iii) the fractured data; and (iv) the verification of the fractured data;
  conditioning said data set to be compatible with said mask manufacturing process and said photomask manufacturing equipment;
  and sending the conditioned data set to a remote manufacturing system associated with the specific photomask manufacturing processing.

20. An automated system for processing mask data by converting design data in a form of an electronic circuit design data file for use in manufacturing a photomask having substantially transparent and substantially opaque features into a data format suitable for a specific photomask manufacturing processing comprising:
  at least one server comprising a memory, a first software component and a second software component for processing mask data, wherein
  said data relating to said mask design is stored in said memory,
  the first software component comprises instructions governing a user's entry of requirements data for processing an order for a photomask made in accordance with the design data and obtainment of information identifying which one of a plurality of photomask manufacture equipment shall be used to manufacture the photomask,
  the second software component comprises instructions for parsing mask pattern data and the requirements data into a format suitable for manufacturing, wherein said second software component comprises instructions for carrying out the following tasks: (i) sizing the design data to facilitate process movement of the substantially transparent and substantially opaque features in the photomask; (ii) fracturing at least a portion of the design data into a substantially ready-to-write format compatible with the specific photomask manufacturing processing; (iii) verifying the integrity of the fractured design data; (iv) merging two or more sets of data from one or more of the following data types: (a) the entered design data; (b) the sized design data; (c) the fractured data; and (d) the verification of the fractured data; (v) conditioning said data set to be compatible with said mask manufacturing process and said photomask manufacture equipment; and
  circuitry for sending the conditioned data set to a remote manufacturing system associated with the specific photomask manufacturing processing.

* * * * *